US012738907B2

(12) United States Patent
Lei et al.

(10) Patent No.: US 12,738,907 B2
(45) Date of Patent: Sep. 15, 2026

(54) RADIO FREQUENCY FRONT-END MODULE

(71) Applicant: RadRock (Chongqing) Tech Co., Ltd., Chongqing (CN)

(72) Inventors: Yongjian Lei, Shenzhen (CN); Yuan Cao, Shenzhen (CN); Jie Gong, Shenzhen (CN); Kaiyao Yu, Shenzhen (CN); Chuanqiu Lei, Shenzhen (CN); Jianxing Ni, Shenzhen (CN)

(73) Assignee: RadRock (Chongqing) Tech Co., Ltd., Chongqing (CN)

( * ) Notice: Subject to any disclaimer, the term of this patent is extended or adjusted under 35 U.S.C. 154(b) by 364 days.

(21) Appl. No.: 18/391,775

(22) Filed: Dec. 21, 2023

(65) Prior Publication Data

US 2024/0223224 A1 Jul. 4, 2024

(30) Foreign Application Priority Data

Dec. 30, 2022 (CN) ......................... 202211741224.9
Mar. 31, 2023 (CN) ......................... 202310338644.0

(51) Int. Cl.

| | |
|---|---|
| ***H03F 3/24*** | (2006.01) |
| ***H04B 1/00*** | (2006.01) |
| ***H04B 1/04*** | (2006.01) |
| ***H04B 1/16*** | (2006.01) |
| ***H05K 1/02*** | (2006.01) |

(52) U.S. Cl.

CPC ........... *H03F 3/245* (2013.01); *H04B 1/0064* (2013.01); *H04B 1/0483* (2013.01); *H04B 1/1615* (2013.01); *H05K 1/0243* (2013.01); *H03F 2200/09* (2013.01); *H04B 2001/0408* (2013.01); *H05K 2201/10166* (2013.01)

(58) Field of Classification Search

CPC ..... H03F 2200/09; H03F 3/245; H04B 1/006; H04B 1/0064; H04B 1/0483; H04B 1/1615; H04B 1/40; H04B 2001/0408; H05K 1/0243; H05K 2201/10166; Y02D 30/70

See application file for complete search history.

(56) References Cited

U.S. PATENT DOCUMENTS

| | | | | |
|---|---|---|---|---|
| 6,483,188 | B1 * | 11/2002 | Yue | H10W 44/20 257/500 |
| 2009/0130993 | A1 * | 5/2009 | Rofougaran | H04B 1/006 455/90.2 |
| 2019/0103843 | A1 * | 4/2019 | Aikawa | H03F 3/189 |
| 2019/0115946 | A1 * | 4/2019 | Pehlke | H04B 1/04 |
| 2020/0253040 | A1 * | 8/2020 | Dalmia | H01Q 1/2283 |

* cited by examiner

*Primary Examiner* — Kashif Siddiqui

(57) ABSTRACT

The application discloses an RF front-end module. The second RF amplifier circuit and the third RF amplifier circuit are integrated in a second RF chip, and the first RF amplifier circuit is integrated in a first RF chip; the RF signals output by the first RF amplifier circuit and the second RF amplifier circuit are output via the first switch chip, and the RF signals output by the third RF amplifier circuit are output via the second switch chip. In this way, two RF amplifier circuits with different frequency bands are integrated into one chip to improve the integration level, and meanwhile, the signal traces on the substrate can be reduced to avoid unnecessary losses caused by too many traces, thus meeting the requirements of RF front-end modules for performance and area.

18 Claims, 4 Drawing Sheets

RADIO FREQUENCY FRONT-END MODULE

CROSS REFERENCE TO RELATED APPLICATIONS

The present application claims the benefit of Chinese Patent Application No. 2022117412249, titled "RF module", filed on Dec. 30, 2022 and Chinese Patent Application No. 2023103386440, titled "RF module", filed on Mar. 31, 2023, the contents of which are incorporated herein by reference in their entirety.

TECHNICAL FIELD

The application relates to the technical field of radio frequency (RF), in particular to an RF front-end module.

BACKGROUND

In the field of RF technology, with the development of science and technology, more and more frequency bands of new RF signals are emerging. As a result, many RF devices need to be installed in RF module, such as power amplifier, switch, capacitor and inductor. Especially, as an active device, the power amplifier often occupies a large area. At present, in order to ensure the performance of each RF device, it is often necessary to use a substrate with multi-layer. However, the increase of the number of substrate layers not only increase the cost, but also lead to a large total occupied area, which is not conducive to the miniaturization design of RF front-end modules. Therefore, how to make a reasonable layout of RF devices on a substrate with limited area has become an urgent problem.

SUMMARY

The embodiment of the application provides an RF front-end module, aiming at solving the problem that the area and performance cannot both be taken into account for RF front-end modules currently.

An RF front-end module is provided, including: a substrate, and a first RF chip, a second RF chip, a first switch chip and a second switch chip arranged on the substrate, wherein the first RF chip includes a first RF amplifier circuit, and the second RF chip includes a second RF amplifier circuit and a third RF amplifier circuit;

the first RF amplifier circuit outputs RF signals via the first switch chip, the second RF amplifier circuit outputs RF signals via the first switch chip, and the third RF amplifier circuit outputs RF signals via the second switch chip.

Further, the first RF amplifier circuit is used for amplifying RF signals in a first frequency band, the second RF amplifier circuit is used for amplifying RF signals in a second frequency band, and the third RF amplifier circuit is used for amplifying RF signals in a third frequency band; wherein the third frequency band is larger than the second frequency band, and the second frequency band is larger than the first frequency band.

Further, the substrate includes M first signal output ends, N second signal output ends and K third signal output ends; the first signal output end is used for outputting RF signals of the first frequency band, the second signal output end is used for outputting RF signals of the second frequency band, and the third signal output end is used for outputting RF signals of the third frequency band; M, N and K are positive integers; and the first switch chip is arranged in an area close to the first signal output end and the second signal output end, and the second switch chip is arranged in an area close to the third signal output end.

Further, M first signal output ends and some of the second signal output ends are arranged on a first side of the substrate, and the first side of the substrate is arranged along a first direction; the rest of the second signal output ends and the K third signal output ends are arranged on a third side of the substrate; the second signal output end arranged on the first side of the substrate and the second signal output end arranged on the third side of the substrate are arranged adjacent to each other, the third side of the substrate is arranged along a second direction, and the first direction and the second direction intersect.

Further, a first output pin of the first switch chip is connected with the first signal output end, the first output pin of the first switch chip is arranged on a fourth side of the first switch chip, and the fourth side of the first switch chip is arranged along the second direction, and the fourth side of the first switch chip is arranged adjacent to the first signal output end;

a second output pin of the first switch chip is connected with the second signal output end, and the second output pin of the first switch chip is arranged on a first side and/or a third side of the first switch chip, the first side of the first switch chip is arranged along the first direction, and the third side of the first switch chip is arranged along the second direction; and the first side of the first switch chip is adjacent to the first side of the substrate, and the third side of the first switch chip is adjacent to the third side of the substrate; and a third output pin of the second switch chip is connected with the third signal output end, the third output pin of the second switch chip is arranged on a third side of the second switch chip, the third side of the first switch chip is arranged along the second direction, and the third side of the second switch chip is arranged adjacent to the third side of the substrate.

Further, the RF front-end module further includes a second matching module and a third matching module;

the RF signals output by the second RF amplifier circuit is transmitted to the first switch chip through the second matching module, the second matching module is arranged between the third side of the second RF chip and the third side of the substrate, and both the third side of the second RF chip and the third side of the substrate are arranged along the second direction;

the RF signals output by the third RF amplifier circuit is transmitted to the second switch chip through the third matching module, and the third matching module is arranged between a second side of the second RF chip and a second side of the substrate, and both the second side of the second RF chip and the second side of the substrate are arranged along the first direction; and the first direction and the second direction intersect.

Further, the second RF chip includes a second signal output pin and a third signal output pin;

the second signal output pin is used to output the RF signals of the second RF amplifier circuit, and the third signal output pin is used to output the RF signals of the third RF amplifier circuit; and the second signal output pin is arranged on the third side of the second RF chip, and the third side of the second RF chip is arranged adjacent to the second matching module, the third signal output pin is arranged on the second side of the second RF chip, and the second side of the second RF chip is arranged adjacent to the third matching module.

Further, the RF front-end module further includes a first matching module and a second matching module, and the RF signals output by the first RF amplifier circuit is transmitted to the first switch chip through the first matching module, the first matching module is arranged between the first RF chip and the first switch chip; the RF signals output by the second RF amplifier circuit is transmitted to the first switch chip through the second matching module, the second matching module is arranged between the third side of the second RF chip and the third side of the substrate, and the third side of the second RF chip and the third side of the substrate are both arranged along the second direction.

Further, the first RF chip include a first signal pin, the first signal pin is used to output the RF signals of the first RF amplifier circuit;

the first signal pin is arranged on a third side of the first RF chip, the third side of the first RF chip is arranged adjacent to the first matching module, and the third side of the first RF chip is arranged along the second direction; or the first signal pin is arranged on a first side of the first RF chip, the first side of the first RF chip is arranged adjacent to the first side of the substrate, and the first side of the first RF chip is arranged along the first direction, and the second direction intersects with the first direction.

Further, the RF front-end module further includes a control chip, and the first RF chip, the control chip and the second RF chip are sequentially arranged along the first direction of the substrate.

Further, a fourth side of the substrate is provided with at least two first signal input ends, and the fourth side of the substrate is arranged along the second direction; the control chip includes a switch unit and a control unit, and the at least two first signal input ends are connected with the first RF chip via the switch unit; the control unit is used for controlling state of the switch unit, so as to switch and enable the first signal input end to input RF signals of different sub-bands to the first RF chip; and the first RF chip and the control chip are arranged adjacent to the first signal input end.

Further, a first area is further arranged between the third matching module and the second side of the substrate, at least one component is arranged in the first area, and the second side of the substrate is arranged along the first direction.

Further, the third matching module includes a first balun, the first balun includes a first coil and a second coil, the first coil and the second coil are coupled with each other to form a first coupling area and a second coupling area, and the first coupling area and the second coupling area are arranged adjacent to each other along the second direction.

Further, the substrate consists of two metal layers.

Further, the substrate is provided with a matching inductor, and the matching inductor is arranged on a same metal layer of the substrate through metal winding.

Further, the RF front-end module further includes a bridge module, and the control chip is connected to the second switch chip through the bridge module; the bridge module includes a first trace, a first jumper wire and a second jumper wire, and the first trace is arranged adjacent to the second matching module, the second switch chip is connected to the control chip through the first jumper wire, the first trace and the second jumper wire in turn.

Further, it includes a substrate, and a second RF chip, a second matching module, a third matching module, a first switch chip and a second switch chip arranged on the substrate; the second RF chip includes a second RF amplifier circuit and a third RF amplifier circuit;

RF signals output by the second RF amplifier circuit is transmitted to the first switch chip through the second matching module, the second matching module is arranged between a third side of the second RF chip and a third side of the substrate, and both the third side of the second RF chip and the third side of the substrate are arranged along a second direction; and RF signals output by the third RF amplifier circuit is transmitted to the second switch chip through the third matching module, and the third matching module is arranged between a second side of the second RF chip and a second side of the substrate, and both the second side of the second RF chip and the second side of the substrate are arranged along a first direction; and the first direction and the second direction intersect.

Further, the second RF chip includes a second signal output pin and a third signal output pin;

the second signal output pin is used to output the RF signals of the second RF amplifier circuit, and the third signal output pin is used to output the RF signals of the third RF amplifier circuit; and the second signal output pin is arranged on the third side of the second RF chip, and the third side of the second RF chip is arranged adjacent to the second matching module, the third signal output pin is arranged on the second side of the second RF chip, and the second side of the second RF chip is arranged adjacent to the third matching module.

Further, the RF front-end module further includes a first RF chip and a first matching module; the first RF chip includes a first RF amplifier circuit, RF signals output by the first RF amplifier circuit is transmitted to the first switch chip through the first matching module, and the first matching module is arranged between the first RF chip and the first switch chip; RF signals output by the second RF amplifier circuit is transmitted to the first switch chip through the second matching module, and the second matching module is arranged between the second RF chip and the first switch chip.

Further, the substrate includes M first signal output ends, N second signal output ends and K third signal output ends; the first signal output end is used to output the RF signals of the first RF amplifier circuit, the second signal output end is used to output the RF signals of the second RF amplifier circuit, and the third signal output end is used to output the RF signals of the third RF amplifier circuit; the first switch chip is arranged in an area close to the first signal output end and the second signal output end, and the second switch chip is arranged in an area close to the third signal output end.

Further, M first signal output ends and some of the second signal output ends are arranged on a first side of the substrate, and the first side of the substrate is arranged along a first direction; the rest of the second signal output ends and the K third signal output ends are arranged on a third side of the substrate; the second signal output end arranged on the first side of the substrate and the second signal output end arranged on the third side of the substrate are arranged adjacent to each other, the third side of the substrate is arranged along a second direction, and the first direction and the second direction intersect.

Further, it includes a substrate, and a first switch chip and a second switch chip arranged on the substrate; the substrate includes M first signal output ends, N second signal output ends and K third signal output ends; the first switch chip includes a first switch circuit and a second switch circuit; the second switch chip includes a third switch circuit, the first switch circuit is used for transmitting RF signals of a first frequency band to the first signal output end for output, the second switch circuit is used for transmitting RF signals of a second frequency band to the second signal output end for output, and the third switch circuit is used for transmitting RF signals of a third frequency band to the third signal output end for output; and the first switch chip is arranged in an area close to the first signal output end and the second signal output end, and the second switch chip is arranged in an area close to the third signal output end.

Further, a first RF chip and a second RF chip; the first RF chip includes a first RF amplifier circuit, the second RF chip includes a second RF amplifier circuit and a third RF amplifier circuit; the first RF amplifier circuit is used for outputting the RF signals of the first frequency band, the second RF amplifier circuit is used for outputting the RF signals of the second frequency band, and RF signals output by the third RF amplifier circuit passes through the RF signals of the third frequency band.

Further, M first signal output ends and some of the second signal output ends are arranged on a first side of the substrate, and the first side of the substrate is arranged along a first direction; the rest of the second signal output ends and the K third signal output ends are arranged on a third side of the substrate; the second signal output end arranged on the first side of the substrate and the second signal output end arranged on the third side of the substrate are arranged adjacent to each other, the third side of the substrate is arranged along a second direction, and the first direction and the second direction intersect.

Further, a first output pin of the first switch chip is connected with the first signal output end, the first output pin of the first switch chip is arranged on a fourth side of the first switch chip, and the fourth side of the first switch chip is arranged along the second direction, and the fourth side of the first switch chip is arranged adjacent to the first signal output end;

a second output pin of the first switch chip is connected with the second signal output end, and the second output pin of the first switch chip is arranged on a first side and/or a third side of the first switch chip, the first side of the first switch chip is arranged along the first direction, and the third side of the first switch chip is arranged along the second direction; and the first side of the first switch chip is adjacent to the first side of the substrate, and the third side of the first switch chip is adjacent to the third side of the substrate; and a third output pin of the second switch chip is connected with the third signal output end, the third output pin of the second switch chip is arranged on a third side of the second switch chip, the third side of the first switch chip is arranged along the second direction, and the third side of the second switch chip is arranged adjacent to the third side of the substrate.

In an embodiment, the RF front-end module includes a substrate, and a first RF chip, a second RF chip, a first switch chip and a second switch chip arranged on the substrate; the first RF chip includes a first RF amplifier circuit, and the second RF chip includes a second RF amplifier circuit and a third RF amplifier circuit; the first RF amplifier circuit outputs RF signals via the first switch chip, the second RF amplifier circuit outputs RF signals via the first switch chip, and the third RF amplifier circuit outputs RF signals via the second switch chip. In this embodiment, in order to improve the integration of the RF chip in the RF front-end module, and considering the large occupied area of components in the signal transmission path of the first RF amplifier circuit, the signal transmission path of the RF front-end module is optimized by integrating the first RF amplifier circuit alone in the first RF chip and integrating the second RF amplifier circuit and the third RF amplifier circuit in the second RF chip. In this way, redundancy and complexity of signal traces are reduced. And, the first RF amplifier circuit and second RF amplifier circuit output RF signals via the first switch chip, the third RF amplifier circuit outputs RF signals via the second switch chip. In this way, the integration of two RF amplifier circuits with different frequency bands on one chip improves the integration level, and meanwhile the purpose of reducing signal traces on the substrate can be achieved, and unnecessary loss caused by excessive traces can be avoided, thus meeting the requirements of the RF front-end module for performance and area.

In another embodiment, the RF front-end module includes a substrate, and a second RF chip, a second matching module, a third matching module, a first switch chip and a second switch chip; the second RF chip includes a second RF amplifier circuit and a third RF amplifier circuit; RF signals output by the second RF amplifier circuit is transmitted to the first switch chip through the second matching module, and the second matching module is arranged between the second RF chip and the first switch chip; RF signals output by the third RF amplifier circuit is transmitted to the second switch chip through the third matching module, and the third matching module is arranged between the second RF chip and the second switch chip. In this embodiment, the second RF amplifier circuit and the third RF amplifier circuit are integrated in the second RF chip, and the positional relationship between the second matching module and the second RF chip and the first switch chip, and the positional relationship between the third matching module and the second RF chip and the second switch chip are reasonably arranged. In this way, two RF amplifier circuits with different frequency bands are integrated into one chip to improve the integration level, and meanwhile, the signal transmission path of the RF front-end module can be optimized, the redundancy and complexity of signal routing can be reduced, and unnecessary losses caused by excessive traces can be avoided, thus meeting the requirements of the RF front-end module for performance and area.

In another specific embodiment, an RF front-end module includes a substrate, and a first switch chip and a second switch chip arranged on the substrate; the substrate includes M first signal output ends, N second signal output ends and K third signal output ends; the first switch chip includes a first switch circuit and a second switch circuit; the second switch chip includes a third switch circuit, the first switch circuit is used for transmitting RF signals of a first frequency band to the first signal output end for output, the second switch circuit is used for transmitting RF signals of a second frequency band to the second signal output end for output, and the third switch circuit is used for transmitting RF signals of a third frequency band to the third signal output end for output; and the first switch chip is arranged in an area close to the first signal output end and the second signal output end, and the second switch chip is arranged in an area close to the third signal output end. In this embodiment, RF signals of the first frequency band and RF signals of the second frequency band are respectively transmitted to the first signal output end and the second signal output end through the first switch chip, RF signals of the third frequency band is transmitted to the third signal output end through the second switch chip, and the first switch chip is arranged in an area close to the first signal output end and the second signal output end, and the second switch chip is arranged in an area close to the third signal output end. In this way, the signal transmission path of RF front-end module can be optimized while improving the integration level, and the redundancy and complexity of signal traces can be reduced, thus avoiding unnecessary loss caused by excessive routing and meeting the requirements of RF front-end module for performance and area.

BRIEF DESCRIPTION OF THE DRAWINGS

In order to explain the technical solution of the embodiments of this application more clearly, the drawings described in the description of the embodiments of this application will be briefly introduced below. Obviously, the drawings in the present application and their accompanying detailed description are directed to merely exemplary embodiments of the application. F or those of ordinary skill in this field, other drawings may be obtained according to these drawings without any creative effort.

Figure 1:
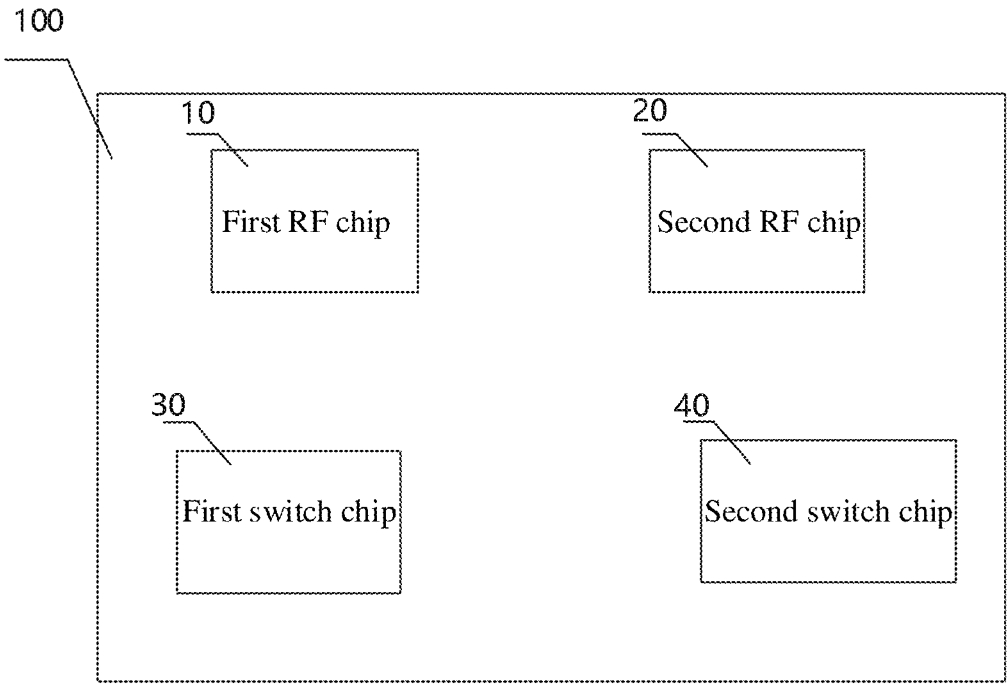
FIG. 1 is a structural schematic diagram of an RF front-end module according to an embodiment of the present application.

Reference signs in the drawings are as follows:

100. Substrate; 10. First RF chip; 20. Second RF chip; 30. First switch chip; 40. Second switch chip; 50. Second matching module; 60. Third matching module; 70. First matching module; 80. Control chip; A1. First signal output end; A2. Second signal output end; A3. Third signal output end; B1. Second signal output pin; B2. Third signal output pin; B3. First signal pin.

DETAILED DESCRIPTION OF PREFERRED EMBODIMENTS

The technical solutions in the embodiments of the present application will be clearly and completely described below with reference to the drawings in the embodiments of this application. Obviously, the described embodiments are part of the embodiments of this application, but not all of them. Based on the embodiments in this application, all other embodiments obtained by those of ordinary skill in the art without creative effort belong to the protection scope of this application.

It should be understood that the exemplary embodiments may be embodied in many different forms and should not be construed as being limited to the exemplary embodiments set forth herein. Rather, these embodiments are provided so that this disclosure will be thorough and complete, and will fully convey the protection scope of this application to those skilled in the art. In the drawings, like reference signs refer to like elements throughout, and the size and relative sizes of layers and regions may be exaggerated for clarity.

It should be understood that when an element or layer is referred to as being "on", "adjacent to", "connected with" or "coupled to" other elements or layers, it may be directly on, adjacent to, connected with or coupled to other elements or layers, or intervening elements or layers. Rather, when an element is referred to as being "directly on", "directly adjacent to", "directly connected with" or "directly coupled to" other elements or layers, there is no intervening element or layer. It should be understood that although the terms first, second, third, etc. are used to describe various elements, components, areas, layers and/or parts, these elements, components, areas, layers and/or parts should not be limited by these terms. These terms are only used to distinguish one element, part, area, layer or part from another element, part, area, layer or part. Therefore, without departing from the teachings of this application, the first element, part, area, layer or part discussed below may be represented as the second element, part, area, layer or part.

Spatial terms such as "below", "under", "above" and "on" may be used here for convenience of description to describe the relationship between one element or feature and other elements or features shown in the Figures. It should be understood that in addition to the orientations shown in the Figures, the spatial relationship terms are intended to include different orientations of devices in use and operation. For example, if the device in the Figures is turned upside down, then the elements or features described as "below" or "under" other elements or features would be "above" or "on" other elements or features. Therefore, the exemplary terms "below" or "under" may include the orientations of "above" or "on". The device may be otherwise oriented (rotated by 90 degrees or other orientations) and the spatial description terms used here are interpreted accordingly.

The terms used here are only for the purpose of describing specific embodiments and not as a limitation of the present application. As used herein, singular forms of "a", "an" and "the/said" are also intended to include plural forms, unless the context clearly indicates otherwise. It should also be understood that the terms "include" and/or "include" used in this specification specify the presence of said features, integers, steps, operations, elements and/or components, but do not exclude the presence or addition of one or more other features, integers, steps, operations, elements, components and/or groups. As used herein, the term "and/or" includes any and all combinations of related listed items.

For a thorough understanding of this application, detailed structures and steps will be set forth in the following description, so as to illustrate the technical solution proposed in the present application. The preferred embodiments of the present application are described in detail as follows, but besides these detailed descriptions, the present application may also have other embodiments.

Figure 2:
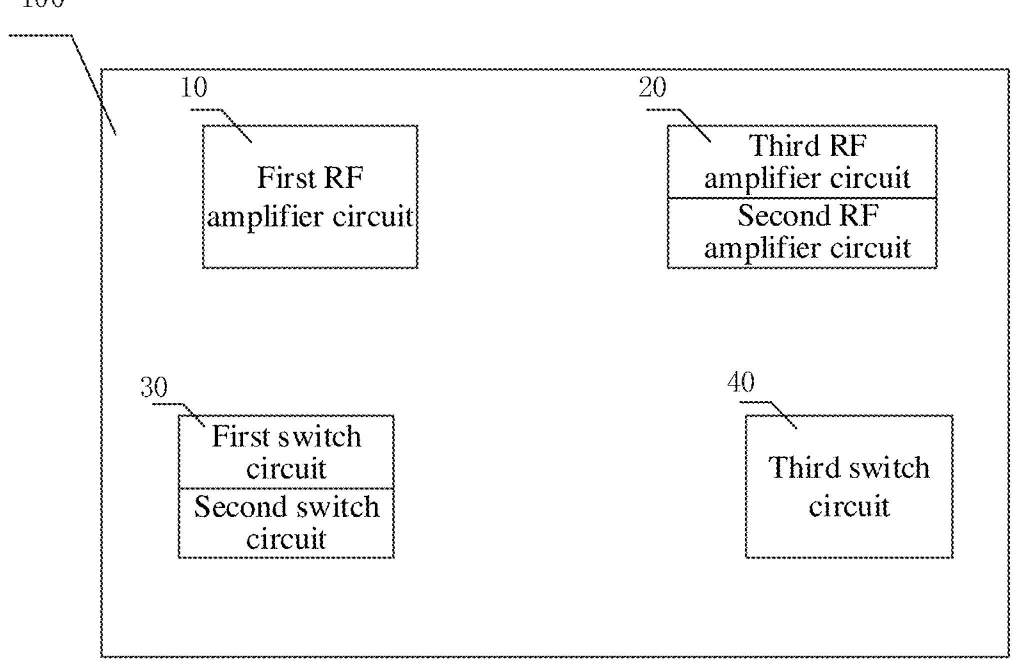
FIG. 2 is a structural schematic diagram of an RF front-end module according to an embodiment of the present application.

This embodiment provides an RF front-end module, as shown in FIG. 1 and FIG. 2 below, including a substrate 100, and a first RF chip 10, a second RF chip 20, a first switch chip 30 and a second switch chip 40 arranged on the substrate 100. The first RF chip 10 includes a first RF amplifier circuit, and the second RF chip 20 includes a second RF amplifier circuit and a third RF amplifier circuit.

The first RF amplifier circuit outputs RF signals via the first switch chip 30, the second RF amplifier circuit outputs RF signals via the first switch chip 30, and the third RF amplifier circuit outputs RF signals via the second switch chip 40.

The first RF chip 10 and the second RF chip 20 are both bare chips with integrated RF amplifier circuits. The RF amplifier circuit may be any type of amplifier circuit in the prior art. For example, it may be a single-ended amplifier circuit, a differential amplifier circuit, a Doherty amplifier circuit, etc. The first RF chip 10 and the second RF chip 20 may be chips realized by any manufacturing process in the prior art. As an example, the first RF chip and the second RF chip are HBT (Heterojunction Bipolar Transistor) chips, i.e., the first RF chip and the second RF chip are realized by HBT (Heterojunction Bipolar Transistor) manufacturing technology.

The first switch chip 30 and the second switch chip 40 are both bare chips integrated with at least one switching device. The first switch chip 30 and the second switch chip 40 may be chips realized by any manufacturing process in the prior art. As an example, the first switch chip 30 and the second switch chip 40 are SOI (Silicon on Insulator) chips, that is, the first switch chip 30 and the second switch chip 40 are realized by SOI (Silicon on Insulator) manufacturing technology.

In a specific embodiment, the first RF chip 10 includes a first RF amplifier circuit, which includes at least one stage of first power amplification transistor and a first bias circuit for providing bias signals for the first power amplification transistor. Alternatively, the first RF amplifier circuit may be a single-ended RF amplifier circuit or any type of amplifier circuit such as a differential RF amplifier circuit. The second RF chip 20 includes a second RF amplifier circuit and a third RF amplifier circuit, and the second RF amplifier circuit includes at least one stage of second power amplification transistor and a second bias circuit for providing bias signals for the second power amplification transistor. Alternatively, the second RF amplifier circuit may be a single-ended RF amplifier circuit or any type of amplifier circuit such as a differential RF amplifier circuit. The third RF amplifier circuit includes at least one stage of third power amplification transistor and a third bias circuit for providing bias signals for the third power amplification transistor. Alternatively, the third RF amplifier circuit may be a single-ended RF amplifier circuit or any type of amplifier circuit such as a differential RF amplifier circuit. This embodiment does not specifically limit the types of the first RF amplifier circuit, the second RF amplifier circuit and the third RF amplifier circuit.

Preferably, the first RF amplifier circuit and the second RF amplifier circuit are both single-ended RF amplifier circuits. That is, each stage of the first RF amplifier circuit and the second RF amplifier circuit adopts a single-ended amplification mode. The third RF amplifier circuit is converted from single-ended to differential RF amplifier circuit. That is, the first stage of the third RF amplifier circuit adopts single-ended amplification and the second stage adopts differential amplification.

In a specific embodiment, the first RF amplifier circuit, the second RF amplifier circuit and the third RF amplifier circuit are circuits for amplifying RF signals in different frequency bands. This embodiment does not specifically limit the size range of the frequency band of the RF signals amplified by the first RF amplifier circuit, the size range of the frequency band of the RF signals amplified by the second RF amplifier circuit and the size range of the frequency band of the RF signals amplified by the third RF amplifier circuit.

In a specific embodiment, the first RF amplifier circuit outputs RF signals via the first switch chip, the second RF amplifier circuit outputs RF signals via the first switch chip, and the third RF amplifier circuit outputs RF signals via the second switch chip. The second switch chip can output RF signals of at least one frequency band. Further, the first switch chip 30 integrates a first switch circuit and a second switch circuit, and the second switch chip 40 integrates a third switch circuit. The first switch circuit is correspondingly connected with the first RF amplifier circuit, the second switch circuit is correspondingly connected with the second RF amplifier circuit, and the third switch circuit is correspondingly connected with the third RF amplifier circuit. The first RF amplifier circuit outputs RF signals via the first switch circuit of first switch chip, the second RF amplifier circuit outputs RF signals via the second switch circuit of first switch chip, and the third RF amplifier circuit outputs RF signals via the third switch circuit of second switch chip.

In this embodiment, the RF front-end module includes a substrate, and a first RF chip, a second RF chip, a first switch chip and a second switch chip arranged on the substrate; the first RF chip includes a first RF amplifier circuit, and the second RF chip includes a second RF amplifier circuit and a third RF amplifier circuit; the first RF amplifier circuit outputs RF signals via the first switch chip, the second RF amplifier circuit outputs RF signals via the first switch chip, and the third RF amplifier circuit outputs RF signals via the second switch chip. In this embodiment, in order to improve the integration of the RF chip in the RF front-end module, and considering the large occupied area of components in the signal transmission path of the first RF amplifier circuit, the signal transmission path of the RF front-end module is optimized by integrating the first RF amplifier circuit alone in the first RF chip and integrating the second RF amplifier circuit and the third RF amplifier circuit in the second RF chip. In this way, redundancy and complexity of signal traces are reduced. And, the first RF amplifier circuit and second RF amplifier circuit output RF signals via the first switch chip, the third RF amplifier circuit outputs RF signals via the second switch chip. In this way, the integration of two RF amplifier circuits with different frequency bands on one chip improves the integration level, and meanwhile the purpose of reducing signal traces on the substrate can be achieved, and unnecessary loss caused by excessive traces can be avoided, thus meeting the requirements of the RF front-end module for performance and area.

In a specific embodiment, the first RF amplifier circuit is used for amplifying RF signals in a first frequency band, the second RF amplifier circuit is used for amplifying RF signals in a second frequency band, and the third RF amplifier circuit is used for amplifying RF signals in a third frequency band; wherein the third frequency band is larger than the second frequency band, and the second frequency band is larger than the first frequency band.

As an example, the first frequency band may be a low frequency band, the second frequency band may be a middle frequency band, and the third frequency band may be a high frequency band. For example, the range of the first frequency band is 663 MHz-915 MHz;

the range of the second frequency band is 1710 MHz-1980 MHz, and the range of the third frequency band is 2300 MHz-2690 MHz. It should be noted that the first frequency band may be divided into a plurality of different first subbands, the second frequency band may be divided into a plurality of different second subbands, and the third frequency band may be divided into a plurality of different third subbands.

In this embodiment, the first RF amplifier circuit is used for amplifying RF signals in a first frequency band, the second RF amplifier circuit is used for amplifying RF signals in a second frequency band, and the third RF amplifier circuit is used for amplifying RF signals in a third frequency band; wherein the third frequency band is larger than the second frequency band, and the second frequency band is larger than the first frequency band. Because the first RF amplifier circuit in low frequency band occupies a large area on the chip, and the components in the signal transmission path of the first RF amplifier circuit in low frequency band occupy a large area. By integrating the first RF amplifier circuit in low frequency band into the first RF chip alone, and integrating the second RF amplifier circuit in middle frequency band and the third RF amplifier circuit in high frequency band into the second RF chip, not only can the integration level of the RF front-end module be improved, but also the signal transmission path of the RF front-end module can be optimized, thus reducing the redundancy and complexity of signal traces, making the layout of the first RF chip and the second RF chip more compact and reasonable.

Figure 3:
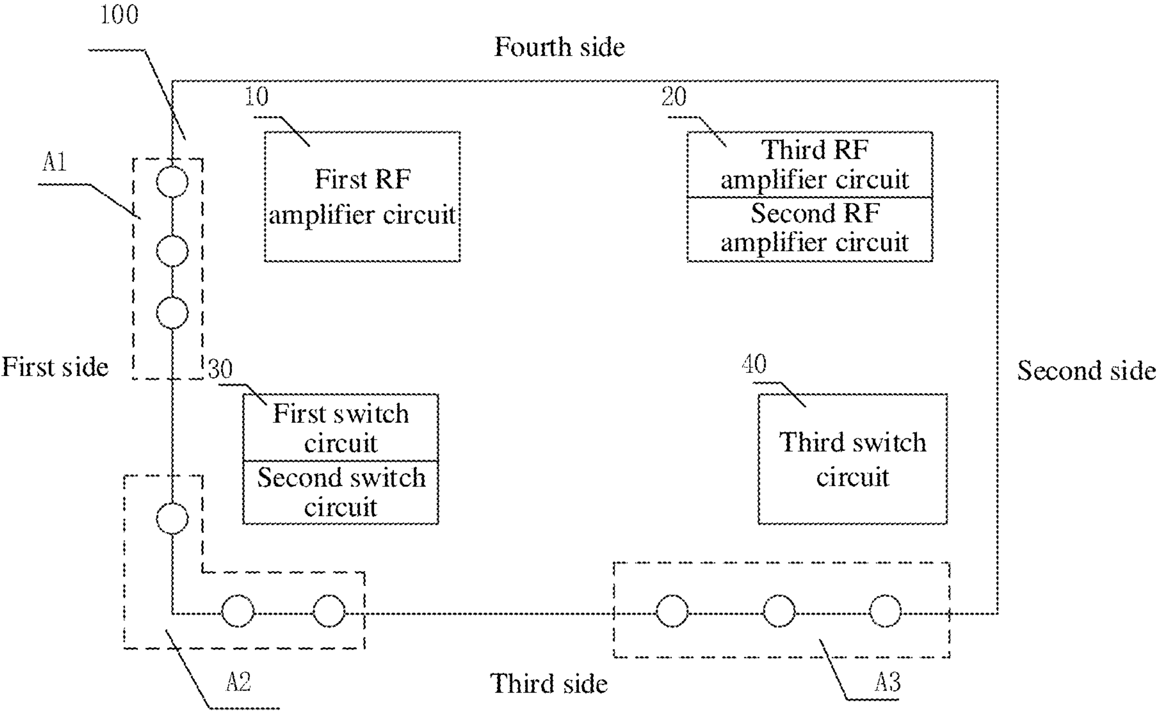
FIG. 3 is a structural schematic diagram of an RF front-end module according to an embodiment of the present application.

In a specific embodiment, as shown in FIG. 3 below, the substrate includes M first signal output ends A1, N second signal output ends A2 and K third signal output ends A3; the first signal output end A1 is used for outputting RF signals of the first frequency band, the second signal output end A2 is used for outputting RF signals of the second frequency band, and the third signal output end A3 is used for outputting RF signals of the third frequency band; and M, N and K are positive integers. For example, the number M of the first signal output end is 2, 3, 4 or 5, etc. The number N of second signal output end is 2, 3, 4 or 5, etc. The number K of the third signal output end is 2, 3, 4 or 5, etc. Different first signal output ends are used to output RF signals of different subbands in the first frequency band; different second signal output ends are used to output RF signals of different subbands in the second frequency band; and different third signal output ends are used to output RF signals of different subbands in the third frequency band. Optionally, the number M of the first signal output end, the number N of the second signal output end and the number K of the third signal output end may be the same or different.

As a specific embodiment, the first switch chip 30 is connected with at least one of the M first signal output ends A1 and at least one of the N second signal output ends A2. The second switch chip 40 is connected to at least one of the K third signal output ends. The RF signals of the first frequency band output by the first RF amplifier circuit is output by at least one of the M first signal output ends A1 after being output by the first switch chip 30; the RF signals of the second frequency band output by the second RF amplifier circuit is output by at least one of the N second signal output ends A2 after being output by the first switch chip 30; and the RF signals of the second frequency band output by the third RF amplifier circuit is output by at least one of the K second signal output ends A3 after being output by the second switch chip 40.

As a specific embodiment, the first switch chip 30 is arranged in the area near the first signal output end and the second signal output end, and the second switch chip 40 is arranged in the area near the third signal output end. Since the RF signals of the first frequency band and the RF signals of the second frequency band output by the first switch chip 30 need to be output through the first signal output end and the second signal output end on the substrate respectively. The RF signals of the third frequency band output by the second switch chip 40 need to be output through the third signal output end on the substrate. Therefore, in this embodiment, by arranging the first switch chip 30 in near the first signal output end and the second signal output end, and arranging the second switch chip 40 near the third signal output end, the signal transmission path between the first switch chip 30 and the first signal output end and the second signal output end can be optimized, and the signal transmission path between the second switch chip 40 and the third signal output end can be optimized, thereby reducing the signal traces on the substrate and optimizing the overall layout of the RF front-end module.

In a specific embodiment, as shown in FIG. 3 below, M first signal output ends and some of the second signal output ends are arranged on a first side of the substrate, and the first side of the substrate is arranged along a first direction; the rest of the second signal output ends and the K third signal output ends are arranged on a third side of the substrate; the second signal output end arranged on the first side of the substrate and the second signal output end arranged on the third side of the substrate are arranged adjacent to each other, the third side of the substrate is arranged along a second direction, and the first direction and the second direction intersect.

Optionally, the first direction is vertical and the second direction is horizontal, or the first direction is horizontal and the second direction is vertical. The second direction intersects with the first direction. For example, the horizontal direction may be the length direction of the substrate and the vertical direction may be the width direction of the substrate. It should be noted that the horizontal direction and the vertical direction in this embodiment include but are not limited to being perpendicular to each other. That is, the angle at which the first direction and the second direction intersect includes but is not limited to 90 degrees. For example, the angle of intersection between the first direction and the second direction may also be 80 degrees, 100 degrees, 120 degrees, 130 degrees, etc., as long as the first direction and the second direction intersect with each other.

As a specific embodiment, this embodiment takes the horizontal direction of the substrate as the first direction and the vertical direction of the substrate as the second direction as an example to illustrate. Specifically, M first signal output ends A1 and some of the second signal output ends A2 are arranged on a first side of the substrate, and the first side of the substrate is arranged along a first direction. For example, the first side of the substrate is arranged along the horizontal direction of the substrate, and the first side of the substrate may be the left side and the right side of the substrate along the horizontal direction. The rest of the second signal output ends and the K third signal output ends are arranged on a third side of the substrate; the third side of the substrate is arranged along a second direction, and the first direction and the second direction intersect. For example, the third side of the substrate is arranged along the vertical direction of the substrate, and the third side of the substrate may be the upper side and the lower side of the substrate along the vertical direction. And the second signal output end arranged on the first side of the substrate and the second signal output end arranged on the third side of the substrate are arranged adjacent to each other. For example, the first side of the substrate is the left side of the substrate in the horizontal direction, and the third side of the substrate is the lower side of the substrate in the vertical direction. In this case, some of the second signal output ends are arranged in the area where the left side of the substrate is adjacent to the lower side of the substrate; and the rest of the second signal output ends are arranged in the area where the lower side of the substrate is adjacent to the left side of the substrate.

In this embodiment, M first signal output ends and some of the second signal output ends are arranged on a first side of the substrate, and the first side of the substrate is arranged along a first direction; the rest of the second signal output ends and the K third signal output ends are arranged on a third side of the substrate; the second signal output end arranged on the first side of the substrate and the second signal output end arranged on the third side of the substrate are arranged adjacent to each other, the third side of the substrate is arranged along a second direction, and the first direction and the second direction intersect. Specifically, the first direction and the second direction intersect, so that the first switch chip 30 may be arranged adjacent to the first signal output end and the second signal output end, and the second switch chip 40 is arranged adjacent to the third signal output end, thereby optimizing the signal transmission path between the first switch chip 30 and the first signal output end and the second signal output end, and optimizing the signal transmission path between the second switch chip 40 and the third signal output end, thus reducing the signal traces on the substrate and optimizing the overall layout of the RF front-end module.

In a specific embodiment, a first output pin of the first switch chip 30 is connected with the first signal output end, the first output pin of the first switch chip 30 is arranged on a fourth side of the first switch chip, and the fourth side of the first switch chip is arranged along the second direction, and the fourth side of the first switch chip 30 is arranged adjacent to the first signal output end; and the first output pin of the first switch chip 30 is used to output the RF signals of the first RF amplifier circuit. The first switch chip 30 includes a first switch circuit connected to the first RF amplifier circuit, and the first output pin of the first switch chip 30 is the output pin of the first switch circuit. The first output pin of the first switch chip 30 is connected with the first signal output end to output the RF signals of the first RF amplifier circuit through the first signal output end.

As an example, the first output pin of the first switch chip 30 is arranged on the fourth side of the first switch chip, which is arranged along the second direction and is adjacent to the first signal output end. The fourth side of the first switch chip is arranged along the second direction, and the fourth side of the first switch chip may be the upper side and the lower side of the first switch chip along the vertical direction. Since the M first signal output ends and some of the second signal output ends are arranged on the first side of the substrate, and the second signal output end arranged on the first side of the substrate and the second signal output end arranged on the third side of the substrate are arranged adjacent to each other. That is, the first signal output end is located in the area where the first side of the substrate is away from the third side of the substrate. Therefore, in order to make the first output pin of the first switch chip 30 be located adjacent to the first signal output end, the fourth side of the first switch chip in this embodiment is the upper side of the first switch chip in the vertical direction. Hence, the signal transmission path between the first output pin of the first switch chip 30 and the first signal output end may be optimized, the signal traces on the substrate may be reduced, and the overall layout of the RF front-end module may be optimized.

Specifically, a second output pin of the first switch chip is connected with the second signal output end, and the second output pin of the first switch chip is arranged on a first side and/or a third side of the first switch chip, the first side of the first switch chip is arranged along the first direction, and the third side of the first switch chip is arranged along the second direction; and the first side of the first switch chip is adjacent to the first side of the substrate, and the third side of the first switch chip is adjacent to the third side of the substrate.

The second output pin of the first switch chip 30 is used to output the RF signals of the second RF amplifier circuit. The first switch chip 30 includes a second switch circuit connected with the second RF amplifier circuit, and the second output pin of the first switch chip 30 is the output pin of the second switch circuit, and the second output pin of the first switch chip 30 is connected with the second signal output end to output the RF signals of the second RF amplifier circuit through the second signal output end.

As an example, a second output pin of the first switch chip is connected with the second signal output end, and the second output pin of the first switch chip is arranged on a first side and/or a third side of the first switch chip, the first side of the first switch chip is arranged along the first direction, and the third side of the first switch chip is arranged along the second direction; and the first side of the first switch chip is adjacent to the first side of the substrate, and the third side of the first switch chip is adjacent to the third side of the substrate. For example, the first direction is horizontal and the second direction is vertical. Some of the second output pins of the first switch chip 30 are arranged on the first side of the horizontal direction of the first switch chip 30, and/or the rest of the second output pins of the first switch chip 30 are arranged on the third side of the vertical direction of the first switch chip 30. For example, the second output pin of the first switch chip 30 is arranged at the left side of the first switch chip 30 in the horizontal direction and/or at the lower side of the first switch chip 30 in the vertical direction. In this way, the signal transmission path between the second output pin of the first switch chip and the second signal output end is optimized, thus reducing the signal traces on the substrate, and further optimizing the overall layout of the RF front-end module.

The third output pin of the second switch chip 40 is connected with the third signal output end, and the third output pin of the second switch chip 40 is arranged on the third side of the second switch chip 40, the third side of the first switch chip is arranged along the second direction, and the third side of the second switch chip is arranged adjacent to the third side of the substrate.

The third output pin of the second switch chip 40 is used to output the RF signals of the third RF amplifier circuit. The second switch chip 40 includes a third switch circuit connected with the third RF amplifier circuit, and the third output pin of the second switch chip 40 is the output pin of the third switch circuit, and the third output pin of the second switch chip 40 is connected with the third signal output end to output the RF signals of the third RF amplifier circuit through the third signal output end.

As an example, the third output pin of the second switch chip 40 is disposed on the third side of the second switch chip, the third side of the first switch chip is disposed along the second direction, and the third side of the second switch chip is disposed adjacent to the third side of the substrate. For example, the second direction is vertical, and the third side of the second switch chip may be the upper side and the lower side of the second switch chip along the vertical direction. Because the third side of the second switch chip is adjacent to the third side of the substrate, if the third side of the substrate is the upper side along the vertical direction, then the third side of the second switch chip is the upper side along the vertical direction; and if the third side of the substrate is the lower side along the vertical direction, then the third side of the second switch chip is the lower side along the vertical direction. In this way, the signal transmission path between the third output pin of the second switch chip and the third signal output end is optimized, thus reducing the signal traces on the substrate, and further optimizing the overall layout of the RF front-end module.

In a specific embodiment, the RF front-end module further includes a second matching module and a third matching module.

The second matching module 50 is a module connected to the second RF amplifier circuit, and performs impedance conversion on RF signals in the second RF amplifier circuit to realize impedance matching. For example, the second matching module 50 may be an input matching module, an inter-stage matching module or an output matching module. The third matching module 60 is a module connected to the third RF amplifier circuit, and performs impedance conversion on RF signals in the third RF amplifier circuit to realize impedance matching. For example, the third matching module 60 may be an input matching module, an inter-stage matching module or an output matching module.

In a specific embodiment, since the second RF chip 20 includes a second RF amplifier circuit and a third RF amplifier circuit, the RF signals output by the second RF amplifier circuit needs to be transmitted to the first switch chip through the second matching module 50, and the RF signals output by the third RF amplifier circuit need to be transmitted to the first switch chip through the third matching module 60, so the positions of the second matching module 50 and the third matching module 60 need to be set reasonably. Therefore, it is necessary to set the positions of the second matching module 50 and the third matching module 60 reasonably to make the signal transmission path between the second RF chip 20 and the first switch chip 30 and the second switch chip 40 as short as possible, so as to optimize the signal transmission path of the second RF amplifier circuit and the signal transmission path of the third RF amplifier circuit, thus reducing the redundancy and complexity of signal traces.

In view of this, in this embodiment, the RF signals output by the second RF amplifier circuit is transmitted to the first switch chip through the second matching module, the second matching module is arranged between the third side of the second RF chip and the third side of the substrate, and the third side of the second RF chip and the third side of the substrate are both arranged along the second direction. For example, the second direction is vertical, the third side of the second RF chip is the lower or upper side of the second RF chip along the vertical direction, and the third side of the substrate is the lower or upper side of the substrate along the vertical direction. The second matching module is arranged in an area between the lower side of the second RF chip along the vertical direction and the lower side of the substrate along the vertical direction, or the second matching module is arranged in an area between the upper side of the second RF chip along the vertical direction and the upper side of the substrate along the vertical direction. In addition, the RF signals output by the third RF amplifier circuit is transmitted to the second switch chip through the third matching module, and the third matching module is arranged between a second side of the second RF chip and a second side of the substrate, and both the second side of the second RF chip and the second side of the substrate are arranged along the first direction; and the first direction and the second direction intersect. For example, the first direction is horizontal; the second side of the second RF chip is the right or left side of the second RF chip along the horizontal direction, and the third side of the substrate is the right or left side of the substrate along the horizontal direction. The second matching module is arranged in an area between the right side of the second RF chip along the horizontal direction and the right side of the substrate along the horizontal direction, or the second matching module is arranged in an area between the left side of the second RF chip along the horizontal direction and the left side of the substrate along the horizontal direction.

In this embodiment, the RF front-end module further includes a second matching module and a third matching module;

The RF signals output by the second RF amplifier circuit is transmitted to the first switch chip through the second matching module, the second matching module is arranged between the third side of the second RF chip and the third side of the substrate, and the third side of the second RF chip and the third side of the substrate are both arranged along the second direction; the RF signals output by the third RF amplifier circuit is transmitted to the second switch chip through the third matching module, and the third matching module is arranged between a second side of the second RF chip and a second side of the substrate, and both the second side of the second RF chip and the second side of the substrate are arranged along the first direction; and the first direction and the second direction intersect. In this way, the signal transmission path between the second RF chip and the first switch chip and the signal transmission path between the second RF chip and the second switch chip can be optimized, the redundancy and complexity of signal traces can be reduced, and the overall layout of the RF front-end module can be optimized.

Figure 5:
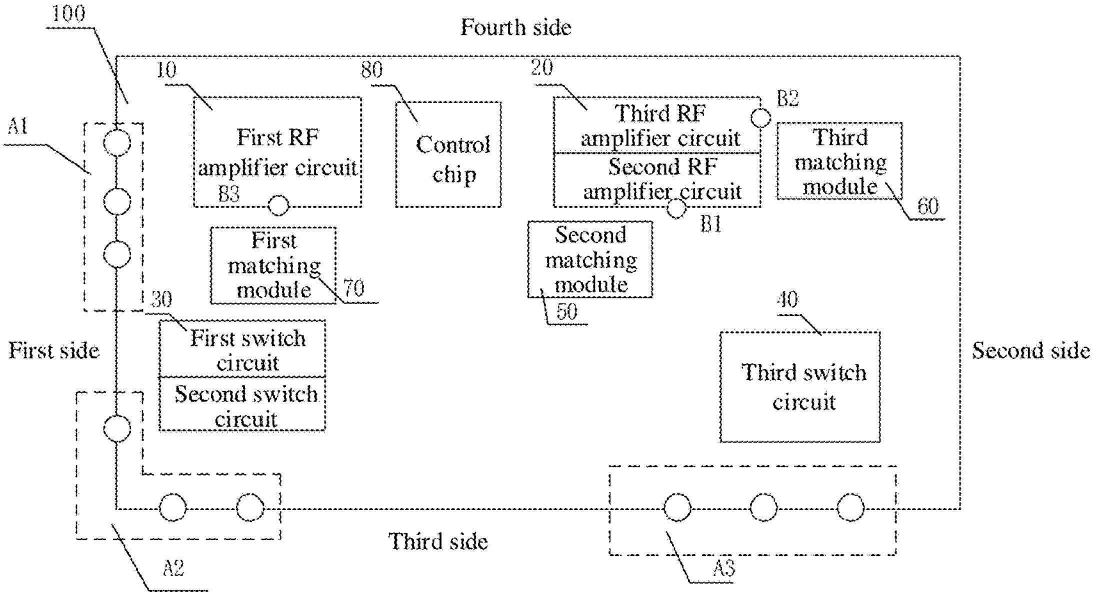
FIG. 5 is a structural schematic diagram of an RF front-end module according to an embodiment of the present application.

In a specific embodiment, as shown in FIG. 5 below, the second RF chip includes a second signal output pin B1 and a third signal output pin B2. The second signal output pin B1 is used for outputting the RF signals of the second RF amplifier circuit, and the third signal output pin B2 is used for outputting the RF signals of the third RF amplifier circuit. The second signal output pin B1 is disposed on the third side of the second RF chip 20, and the third side of the second RF chip 20 is disposed adjacent to the second matching module 50. The third signal output pin B2 is disposed on the second side of the second RF chip 20, and the second side of the second RF chip 20 is disposed adjacent to the third matching module 60.

The number of the second signal output pin B1 or the third signal output pin B2 may be one or more. The second signal output pin B1 is used for outputting the RF signals of the second RF amplifier circuit, and the third signal output pin B2 is used for outputting the RF signals of the third RF amplifier circuit. Therefore, in order to avoid the signal trace between the second signal output pin B1 of the second RF chip and the second matching module 50 being too long and the signal trace between the third signal output pin B2 of the second RF chip and the third matching module 60 being too long. In this embodiment, the second signal output pin B1 is arranged on the third side of the second RF chip 20. For example, the third side of the second RF chip 20 is the lower side along the vertical direction, the third side of the second RF chip 20 is arranged adjacent to the second matching module 50, thus reducing the signal transmission distance between the second signal output pin B1 of the second RF chip 20 and the second matching module 50, and further reducing the length of signal traces. The third signal output pin B2 is arranged on the second side of the second RF chip 20. For example, the second side of the second RF chip 20 is the right side along the horizontal direction, and the second side of the second RF chip 20 is arranged adjacent to the third matching module 60. Therefore, the signal transmission path between the third signal output pin B2 of the second RF chip 20 and the third matching module 60 is optimized, and the redundancy and complexity of signal routing are reduced. Thereby achieving the purpose of reducing signal traces on the substrate while ensuring normal signal transmission.

In another specific embodiment, the transmission direction of the RF signals of the second RF amplifier output by the second RF chip to the first switch chip through the second matching module is a first clockwise direction. The first clockwise direction is the direction that runs slowly from the upper right to the lower left. The transmission direction of the RF signals of the third RF amplifier circuit output by the second RF chip to the second switch chip through the third matching module is a second clockwise direction. The second clockwise direction is a direction that slowly runs from the upper left to the lower right. It can be understood that, the transmission directions of the RF signals of the second RF amplifier circuit and the RF signals of the third RF amplifier circuit output by the second RF chip are both clockwise, and they do not interfere with each other. Therefore, the mutual overlap between signal traces on the substrate and the mutual interference between RF signals can be avoided, and the purpose of optimizing the overall substrate layout can be achieved.

In a specific embodiment, referring to FIGS. 4 and 5 below, the RF front-end module further includes a first matching module 70 and a second matching module 50. The RF signals output by the first RF amplifier circuit is transmitted to the first switch chip 30 through the first matching module 70, and the first matching module 70 is arranged between the first RF chip 10 and the first switch chip 30. The RF signals output by the second RF amplifier circuit is transmitted to the first switch chip 30 through the second matching module 50, and the second matching module 50 is arranged between the third side of the second RF chip 20 and the third side of the substrate, and both the third side of the second RF chip and the third side of the substrate are arranged along the second direction.

The first matching module 70 is a module connected to the first RF amplifier circuit, and performs impedance conversion on the RF signals in the first RF amplifier circuit to realize impedance matching. For example, the first matching module 70 may be an input matching module, an inter-stage matching module or an output matching module. The second matching module 50 is a module connected to the second RF amplifier circuit, and performs impedance conversion on RF signals in the second RF amplifier circuit to realize impedance matching. For example, the second matching module 50 may be an input matching module, an inter-stage matching module or an output matching module.

In a specific embodiment, the RF signals output by the first RF amplifier circuit are transmitted to the first switch chip 30 through the first matching module 70, and the RF signals output by the second RF amplifier circuit are transmitted to the first switch chip 30 through the second matching module 50. Since the first RF amplifier circuit is arranged in the first RF chip 10, the second RF amplifier circuit is arranged in the second RF chip 20. It is necessary to design the positions of the first matching module 70 and the second matching module 50 appropriately, so as to make the signal transmission path between the first switch chip 30 and the first RF chip 10 and the second RF chip 20 as short as possible, thereby achieving the purpose of reducing the signal routing on the substrate.

In this regard, in this embodiment, the first matching module 70 is arranged between the first RF chip 10 and the first switch chip 30. Optionally, the arrangement of the first matching module 70 between the first RF chip 10 and the first switch chip 30 means that the first matching module 70 is arranged on the connection path between the first RF chip 10 and the first switch chip 30. The second matching module 50 is disposed between the third side of the second RF chip 20 and the third side of the substrate, and both the third side of the second RF chip and the third side of the substrate are disposed along the second direction. For example, the second direction is the vertical direction of the substrate, and the second matching module 50 is arranged between the vertical third side of the second RF chip 20 and the vertical third side of the substrate. Since the first switch chip 30 is arranged in an area close to the third side of the substrate, the second matching module 50 is arranged between the third side of the second RF chip 20 and the third side of the substrate. In this way, the signal transmission path between the second RF chip 20 and the first switch chip can be optimized. And by arranging the first matching module 70 between the first RF chip 10 and the first switch chip 30, the signal transmission path between the first RF chip 10 and the first switch chip can be optimized, and the interference between the RF signals of the first RF amplifier circuit output by the first RF chip and the RF signals of the second RF amplifier circuit output by the second RF chip can be reduced when the signals are transmitted to the first switch chip, thus optimizing the overall layout of substrate.

In a specific embodiment, the first RF chip includes a first signal pin B3, and the first signal pin is used to output the RF signals of the first RF amplifier circuit. The number of the first signal pin B3 may be one or more. The first signal pin is arranged on a third side of the first RF chip, and the third side of the first RF chip is adjacent to the first matching module and arranged along a second direction. For example, the second direction is vertical. The third side of the first RF chip may be the upper side or the lower side of the first RF chip along the vertical direction. Since the third side of the first RF chip is arranged adjacent to the first matching module, and the first matching module is arranged between the first RF chip and the first switch chip, hence, the third side of the first RF chip is the lower side of the first RF chip along the vertical direction.

the first signal pin is arranged on a first side of the first RF chip, the first side of the first RF chip is arranged adjacent to the first side of the substrate, and the first side of the first RF chip is arranged along the first direction, and the second direction intersects with the first direction. For example, the first direction is horizontal. The first side of the first RF chip may be the left side or the right side of the first RF chip along the horizontal direction. Since the first side of the first RF chip is arranged adjacent to the first side of the substrate, if the first side of the substrate is the left side of the substrate along the horizontal direction, then the first side of the RF chip is also the left side along the horizontal direction, and if the first side of the substrate is the right side of the substrate along the horizontal direction, then the first side of the first RF chip is also the right side along the horizontal direction.

In this embodiment, the first RF chip include a first signal pin, the first signal pin is used to output the RF signals of the first RF amplifier circuit; the first signal pin is arranged on a third side of the first RF chip, the third side of the first RF chip is arranged adjacent to the first matching module, and the third side of the first RF chip is arranged along the second direction; or the first signal pin is arranged on a first side of the first RF chip, the first side of the first RF chip is arranged adjacent to the first side of the substrate, and the first side of the first RF chip is arranged along the first direction, and the second direction intersects with the first direction. Thereby optimizing the signal transmission path between the first signal pin B3 of the first RF chip and the first signal output end of the substrate, and further reducing the signal traces on the substrate.

In another specific embodiment, the transmission direction of the RF signals of the first RF amplifier output by the first RF chip to the first switch chip through the first matching module is a third clockwise direction. The third clockwise direction is the direction that runs slowly from the upper right to the lower left. In this embodiment, the transmission direction of the RF signals of the second RF amplifier circuit output by the first RF chip to the first switch chip through the first matching module is the third chronological direction, thereby optimizing the signal transmission path of the RF signals of the first RF amplifier circuit on the substrate, and achieving the purposes of reducing signal traces on the substrate and optimizing the overall substrate layout.

In a specific embodiment, the RF front-end module further includes a control chip, and the first RF chip, the control chip and the second RF chip are sequentially arranged along the first direction of the substrate. For example, the first direction is horizontal, and the first RF chip, the control chip and the second RF chip are sequentially arranged along the horizontal direction of the substrate. In this embodiment, by arranging the control chip between the first RF chip and the second RF chip, the signal transmission path between the control chip and the first RF chip and the second RF chip can be optimized, thereby facilitating the control chip to control the first RF chip and the second RF chip.

As an example, the control chip obtains control commands from communication equipment through MIPI (Mobile Industry Processor Interface), i.e., through VIO, SCLK and SDATA pins, so as to control the working states of the first RF amplifier circuit in the first RF chip, the second RF amplifier circuit and the third RF amplifier circuit in the second RF chip. Optionally, the control chip is a CMOS (Complementary Metal Oxide Transistor) chip, i.e., the control chip is realized by CMOS (Complementary Metal Oxide Transistor) manufacturing technology.

Figure 4:
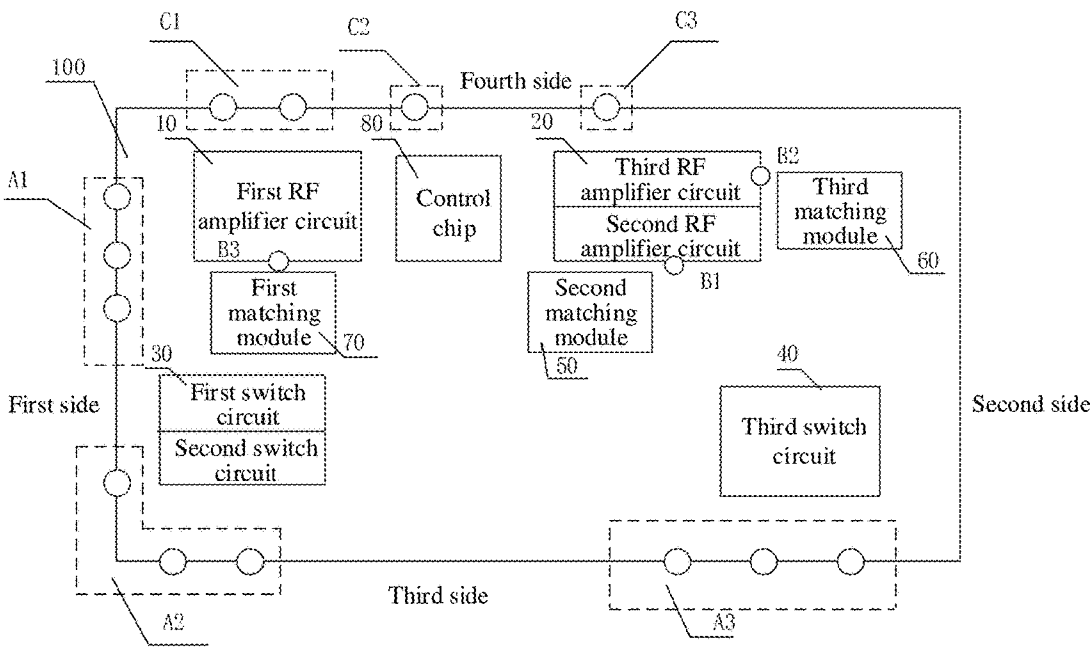
FIG. 4 is a structural schematic diagram of an RF front-end module according to an embodiment of the present application.

In a specific embodiment, as shown in FIG. 4 below, the fourth side of the substrate is provided with at least two first signal input ends C1, and the fourth side of the substrate is arranged along the second direction. For example, the second direction is vertical, and the fourth side of the substrate is the upper side along the vertical direction. The control chip includes a switch unit and a control unit, the at least two first signal input ends C1 are connected with the first RF chip through the switch unit, and the control unit is used for controlling the state of the switch unit, so as to switch and enable the first signal input end C1 to input RF signals of different sub-bands to the first RF chip. And, the first signal input end C1 is used for inputting RF signals of the first frequency band into the first RF amplifier circuit of the first RF chip. Different first signal input ends C1 are used for inputting RF signals of different sub-bands in the first frequency band. For example, the range of the first frequency band is 663 MHz-915 MHZ, and the fourth side of the substrate is provided with two first signal input ends, wherein one first signal input end C1 is used for inputting an RF signal with a sub-band of 663 MHz-715 MHz, and the other first signal input end C1 is used for inputting an RF signal with a sub-band of 717 MHz-915 MHz. The switch unit includes a first fixed end, a second fixed end and a moving end, wherein the first fixed end of the switch unit is connected with one of the first signal input ends, the second fixed end is connected with another first signal input end, and the moving end is connected with the first RF chip. The control unit is used for controlling state of the switch unit, so as to switch and enable the first signal input end C1 to input RF signals of different sub-bands to the first RF chip.

In a specific embodiment, the frequency band corresponding to the RF signals of the first RF amplifier circuit is wide, so this embodiment includes at least two first signal input ends C1 for inputting RF signals of different sub-bands in the first frequency band. When the RF signal of 663 MHz-715 MHz needs to be input, the control unit controls the moving end of the switch unit to be connected with the first fixed end. At this point, the RF signal of 663 MHz-715 MHz is transmitted to the first RF amplifier circuit through one of the first signal input ends C1 for amplification. When the RF signal of 717 MHz-915 MHz needs to be input, the control unit controls the moving end of the switch unit to be connected with the second fixed end. At this point, the RF signal of 663 MHz-715 MHz is transmitted to the first RF amplifier circuit through another first signal input end for amplification.

The first RF chip and the control chip are arranged adjacent to the first signal input end. Since the RF signals of the first frequency band input by the first signal input end need to be transmitted to the first RF chip through the switch unit in the control chip, and the control unit in the control chip needs to control the state of the switch unit, in this embodiment, by arranging the first RF chip and the control chip adjacent to the first signal input end C1, the signal transmission distance between the first signal input C1, the control chip and the first RF chip can be reduced, thus reducing the signal traces on the substrate, so as to optimize the overall layout of the RF front-end module.

In another specific embodiment, the fourth side of the substrate is further provided with at least one second signal input C2 and at least one third signal input C2, and the fourth side of the substrate is arranged along the second direction. For example, the second direction is vertical, and the fourth side of the substrate is the upper side along the vertical direction. Specifically, the second signal input end C2 is used for inputting RF signals of the second frequency band into the second RF amplifier circuit of the second RF chip. The third signal input end C3 is used for inputting RF signals of the third frequency band into the third RF amplifier circuit of the second RF chip. And, the second RF chip is arranged adjacent to the third signal input end C3. The second signal input C2 is disposed between the first signal input end C1 and the third signal input end C3.

In a specific embodiment, the third matching module includes a first input end, a first output end, and any combination of at least one capacitor and at least one inductor arranged between the first input end and the first output end, wherein the capacitor is arranged on the substrate in the form of surface mount device, and the inductor is arranged on the substrate in the form of surface mount device, or the inductor is arranged on the substrate in the form of metal winding.

As an example, the third matching module performs impedance conversion on the RF signals output by the third RF amplifier circuit to achieve impedance matching. Because the working frequency band of the third RF amplifier circuit is high, the performance requirements of the third matching module are also high. When it needs to meet the demand of low cost, the third matching module adopts a single-ended matching mode consisting of capacitors and inductors. In this embodiment, both the inductor and the capacitor are directly arranged on the substrate. For example, the capacitor is arranged on the substrate in the form of surface mount device, the inductor is arranged on the substrate in the form of surface mount device; or the inductor is arranged on the substrate in the form of metal winding, so that the occupied area can be saved, and the cost of related design implementation can be reduced.

In a specific embodiment, a first area is further arranged between the third matching module and the second side of the substrate, at least one component is arranged in the first area, and the second side of the substrate is arranged along the first direction.

As an example, the components in the third matching module may be reasonably arranged (for example, the components in the third matching module are arranged along the second direction), so that a first area is left between the third matching module and the second side of the substrate for arranging other components, such as power lines, thus the space utilization rate and integration of the substrate can be further improved. And a second side of the substrate is arranged along the first direction. For example, the first direction is horizontal and the second direction is vertical. In this embodiment, the components in the third matching module are arranged along the vertical direction, so that a first area is left between the third matching module and the second side of the substrate along the horizontal direction for layout of other components, thus making the layout of the third matching module more compact and reasonable.

In a specific embodiment, the third matching module includes a first balun, the first balun includes a first coil and a second coil, the first coil and the second coil are coupled with each other to form a first coupling area and a second coupling area, and the first coupling area and the second coupling area are arranged adjacent to each other along the second direction.

As an example, when the first coil and the second coil of the first balun are coupled with each other to form a first coupling area and a second coupling area, and the first coupling area and the second coupling area are arranged adjacent to each other along the second direction, there is still a vacant space between the first balun and the second side of the substrate, so the area between the first balun and the second side of the substrate may be used to lay out other components, such as power lines. Thus, the space utilization and integration of substrate can be further improved.

Figure 6:
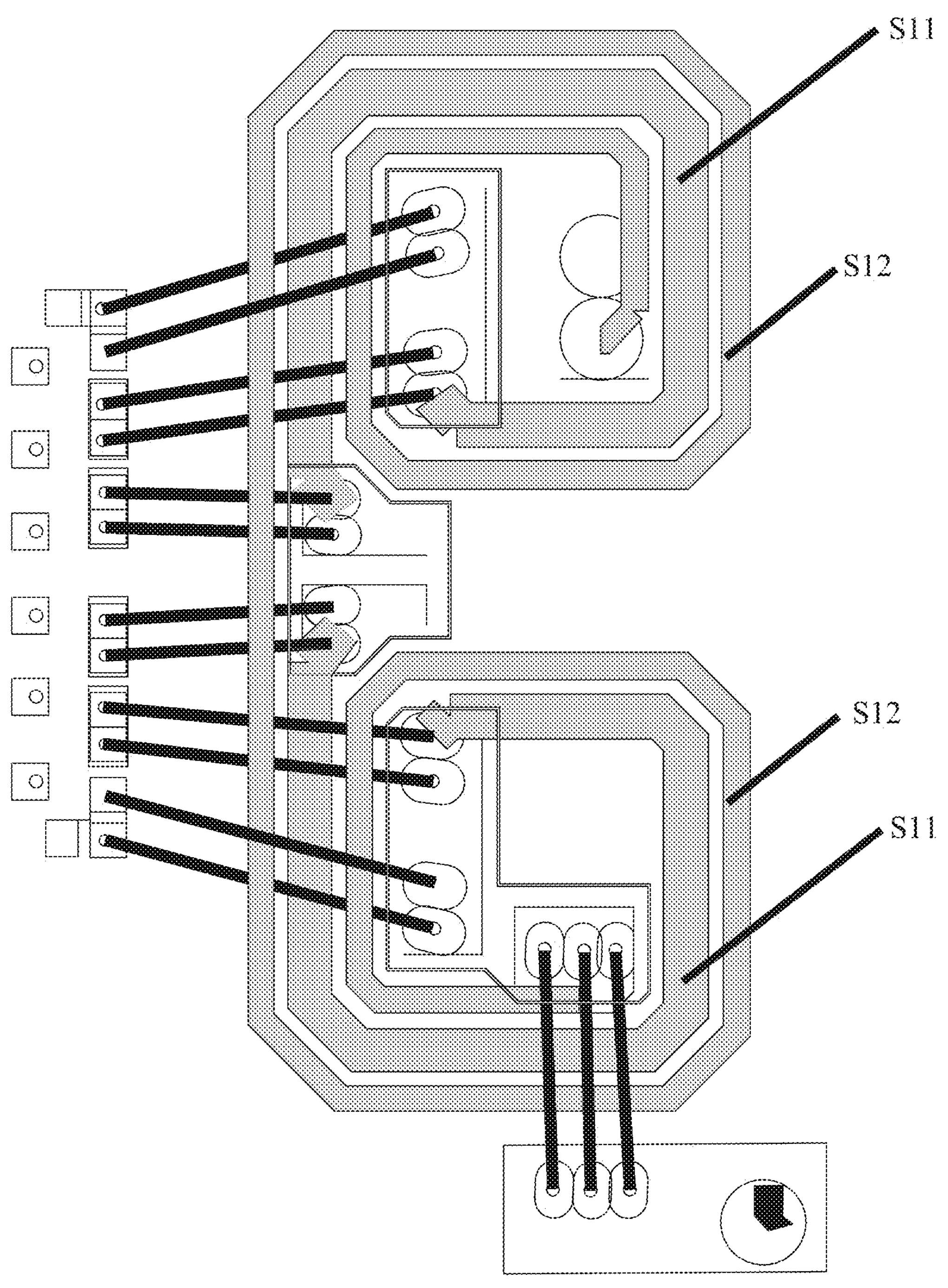
FIG. 6 is a structural schematic diagram of an RF front-end module according to an embodiment of the present application.

In this embodiment, referring to FIG. 6, the first coil S11 and the second coil S12 are coupled with each other to form a first coupling area and a second coupling area, which are arranged adjacent to each other along the second direction. Compared with the single-coupling-center balun, the structure and layout of the double-coupling-center balun are flatter while achieving the same performance, which is more conducive to the overall layout of the first balun on the substrate. For example, the first coil and second coil are coupled in the same layer on a substrate. The first coil includes a first coil segment and a second coil segment which are connected with each other; the second coil includes a third coil segment and a fourth coil segment which are connected with each other; and the first coil segment and second coil segment are relatively separated, the third coil segment and fourth coil segment are relatively separated. The first coil segment and third coil segment are coupled with each other to form a first coupling area, and the second coil segment and fourth coil segment are coupled with each other to form a second coupling area. The first coupling area and second coupling area are adjacently arranged along a second direction, that is, the first coupling area and second coupling area are adjacently arranged between the second RF chip and the second side of the substrate from top to bottom along the second direction (for example, vertical direction). It should be noted that in this embodiment, the specific winding mode of the first coil and the second coil is not specifically limited, and it is only needs ensure that the first coil and the second coil are coupled with each other to form the first coupling area and second coupling area. And the first coupling area and second coupling area are arranged adjacent to each other along the second direction, thereby improving the space utilization and integration of the substrate.

In a specific embodiment, the third matching module includes a first balun including a first coil S11 and a second coil S12, and the first coil S11 and the second coil S12 are coupled with each other to form a first coupling area.

As an example, when better bandwidth performance is required, the third matching module uses a balun for impedance conversion to achieve impedance matching. In this embodiment, the first coil S11 and the second coil S12 are coupled with each other to form a coupling area. For example, the first coil S11 and the second coil S12 are coupled in the same layer on the substrate. Specifically, the second coil includes a first coil segment and a second coil segment, and the first coil is arranged between the first coil segment and the second coil segment; the first coil is respectively coupled with the first coil segment and second coil segment. A second end of the first coil segment and a first end of the second coil segment are connected through jumper wires; and both ends of the first coil are respectively connected with two output ends of a third RF chip. In this embodiment, the second coil is designed in sections, including a first coil section and a second coil section, which makes the wiring layout of the first coil, the first coil section and the second coil section on the same metal layer more flexible and convenient, thus optimizing the bandwidth performance.

In a specific embodiment, the substrate consists of two metal layers. For example, the substrate includes a first metal layer and a second metal layer arranged from top to bottom, and the traces, winding inductance and patch components in the RF front-end module are all arranged on the first metal layer, and the second metal layer is used for connecting with the ground.

As an example, the substrate in this embodiment is composed of two metal layers, and all components such as traces, winding inductance and patch components of the RF front-end module are arranged on the first metal layer, and the second metal layer is used to connect with the ground. By reasonably arranging the components, traces or winding inductance on the first metal layer, the cost can be saved and the space utilization rate of the substrate can be improved while ensuring the performance, thereby improving the integration of the RF front-end module.

In a specific embodiment, the substrate is provided with a matching inductor, and the matching inductor is arranged on a same metal layer of the substrate through metal winding. The matching inductor may be the matching inductor in the first matching module, the second matching module and the third matching module. In this embodiment, the matching inductor is arranged on the same metal layer of the substrate in the form of metal winding, so that the occupied area can be saved, and a larger inductance can be obtained compared with the patch inductor.

In a specific embodiment, the RF front-end module further includes a bridge module, and the control chip is connected to the second switch chip through the bridge module; the bridge module includes a first trace, a first jumper wire and a second jumper wire, and the first trace is arranged adjacent to the second matching module, the second switch chip is connected to the control chip through the first jumper wire, the first trace and the second jumper wire in turn.

As an example, the distance between the control chip and the second switch chip is relatively long, and the connection path is also provided with a second matching module. Therefore, the jumper wire connected between the control chip and the second switch chip would be very long. In this embodiment, the first trace on a small section of substrate is used for bridging, that is, the second switch chip is connected to the control chip through the first jumper wire, the first trace and the second jumper wire in turn. This can not only avoid the packaging risk caused by the oversize of the first jumper wire and the second jumper wire, but also make the layout of the second matching module more reasonable and flexible.

In a specific embodiment, referring to FIG. 4 below, the application also provides an RF front-end module, including a substrate, and a second RF chip 20, a second matching module 50, a third matching module 60, a first switch chip 30 and a second switch chip 40 arranged on the substrate; and the second RF chip 20 includes a second RF amplifier circuit and a third RF amplifier circuit.

The second matching module 50 is a module connected to the second RF amplifier circuit, and performs impedance conversion on RF signals in the second RF amplifier circuit to realize impedance matching. For example, the second matching module 50 may be an input matching module, an inter-stage matching module or an output matching module. The third matching module 60 is a module connected to the third RF amplifier circuit, and performs impedance conversion on RF signals in the third RF amplifier circuit to realize impedance matching. For example, the third matching module 60 may be an input matching module, an intermediate matching module or an output matching module.

RF signals output by the second RF amplifier circuit is transmitted to the first switch chip through the second matching module, the second matching module is arranged between a third side of the second RF chip and a third side of the substrate, and both the third side of the second RF chip and the third side of the substrate are arranged along a second direction. RF signals output by the third RF amplifier circuit is transmitted to the second switch chip through the third matching module, and the third matching module is arranged between a second side of the second RF chip and a second side of the substrate, and both the second side of the second RF chip and the second side of the substrate are arranged along a first direction; and the first direction and the second direction intersect.

In a specific embodiment, since the second RF chip 20 includes a second RF amplifier circuit and a third RF amplifier circuit, the RF signals output by the second RF amplifier circuit need to be transmitted to the first switch chip through the second matching module 50, the RF signals output by the third RF amplifier circuit need to be transmitted to the first switch chip through the third matching module 60. Thus the positions of the second matching module 50 and the third matching module 60 need to be arranged reasonably, so that the signal transmission path between the second RF chip 20, the first switch chip 30 and the second switch chip 40 is as short as possible, thereby achieving the purpose of reducing signal routing on the substrate.

In view of this, in this embodiment, the RF signals output by the second RF amplifier circuit is transmitted to the first switch chip through the second matching module, the second matching module is arranged between the third side of the second RF chip and the third side of the substrate, and the third side of the second RF chip and the third side of the substrate are both arranged along the second direction. For example, the second direction is vertical, the third side of the second RF chip is the lower or upper side of the second RF chip along the vertical direction, and the third side of the substrate is the lower or upper side of the substrate along the vertical direction. The second matching module is arranged in an area between the lower side of the second RF chip along the vertical direction and the lower side of the substrate along the vertical direction, or the second matching module is arranged in an area between the upper side of the second RF chip along the vertical direction and the upper side of the substrate along the vertical direction. In addition, the RF signals output by the third RF amplifier circuit is transmitted to the second switch chip through the third matching module, and the third matching module is arranged between a second side of the second RF chip and a second side of the substrate, and both the second side of the second RF chip and the second side of the substrate are arranged along the first direction; and the first direction and the second direction intersect. For example, the first direction is horizontal; the second side of the second RF chip is the right or left side of the second RF chip along the horizontal direction, and the third side of the substrate is the right or left side of the substrate along the horizontal direction. The second matching module is arranged in an area between the right side of the second RF chip along the horizontal direction and the right side of the substrate along the horizontal direction, or the second matching module is arranged in an area between the left side of the second RF chip along the horizontal direction and the left side of the substrate along the horizontal direction.

In this embodiment, the RF front-end module includes a substrate, and a second RF chip, a second matching module, a third matching module, a first switch chip and a second switch chip arranged on the substrate; and the second RF chip includes a second RF amplifier circuit and a third RF amplifier circuit. The RF signals output by the second RF amplifier circuit are transmitted to the first switch chip through the second matching module, the second matching module is arranged between the second RF chip and the first switch chip; the RF signals output by the third RF amplifier circuit are transmitted to the second switch chip through the third matching module, and the third matching module is arranged between the second RF chip and the second switch chip. In this embodiment, the second RF amplifier circuit and the third RF amplifier circuit are integrated in the second RF chip, the positional relationship between the second matching module and the second RF chip and the first switch chip and the positional relationship between the third matching module and the second RF chip and the second switch chip are reasonably arranged. In this way, two RF amplifier circuits with different frequency bands are integrated into one chip to improve the integration level, and meanwhile, the signal transmission paths of the RF signal output by the second RF amplifier circuit and the RF signal output by the third RF amplifier circuit on the substrate can be optimized, so that the signal traces on the substrate can be reduced, and unnecessary loss caused by excessive routing can be avoided, thus meeting the requirements of the RF front-end module for performance and area.

In a specific embodiment, the second RF chip includes a second signal output pin and a third signal output pin; the second signal output pin is used to output the RF signals of the second RF amplifier circuit, and the third signal output pin is used to output the RF signals of the third RF amplifier circuit.

the second signal output pin is arranged on the third side of the second RF chip, and the third side of the second RF chip is arranged adjacent to the second matching module, the third signal output pin is arranged on the second side of the second RF chip, and the second side of the second RF chip is arranged adjacent to the third matching module.

The number of the second signal output pin B1 or the third signal output pin B2 may be one or more. The second signal output pin B1 is used for outputting the RF signals of the second RF amplifier circuit, and the third signal output pin B2 is used for outputting the RF signals of the third RF amplifier circuit. Therefore, in order to avoid the signal trace between the second signal output pin B1 of the second RF chip and the second matching module 50 being too long and the signal trace between the third signal output pin B2 of the second RF chip and the third matching module 60 being too long. In this embodiment, the second signal output pin B1 is arranged on the third side of the second RF chip 20. For example, the third side of the second RF chip 20 is the lower side along the vertical direction, the third side of the second RF chip 20 is arranged adjacent to the second matching module 50, thus reducing the signal transmission distance between the second signal output pin B1 of the second RF chip 20 and the second matching module 50, and further reducing the length of signal traces. The third signal output pin B2 is arranged on the second side of the second RF chip 20. For example, the second side of the second RF chip 20 is the right side along the horizontal direction, and the second side of the second RF chip 20 is arranged adjacent to the third matching module 60. In this way, the signal transmission path between the third signal output pin B2 of the second RF chip 20 and the third matching module 60 is optimized, thereby reducing the length of signal trace. Thus achieving the purpose of reducing signal trace on the substrate while ensuring normal signal transmission.

In a specific embodiment, the RF front-end module further includes a first RF chip and a first matching module; the first RF chip includes a first RF amplifier circuit, RF signals output by the first RF amplifier circuit is transmitted to the first switch chip through the first matching module, and the first matching module is arranged between the first RF chip and the first switch chip; RF signals output by the second RF amplifier circuit is transmitted to the first switch chip through the second matching module, and the second matching module is arranged between the second RF chip and the first switch chip.

The first matching module 70 is a module connected to the first RF amplifier circuit, and performs impedance conversion on the RF signals in the first RF amplifier circuit to realize impedance matching. For example, the first matching module 70 may be an input matching module, an inter-stage matching module or an output matching module. The second matching module 50 is a module connected to the second RF amplifier circuit and used for impedance conversion and impedance matching of RF signals in the second RF amplifier circuit. For example, the second matching module 50 may be an input matching module, an inter-stage matching module or an output matching module.

In a specific embodiment, the RF signals output by the first RF amplifier circuit are transmitted to the first switch chip 30 through the first matching module 70, The RF signals output by the second RF amplifier circuit are transmitted to the first switch chip 30 through the second matching module 50. That is, both the RF signals output by the first RF amplifier circuit and RF signals output by the second RF amplifier circuit are output through the first switch chip 30. As a result, by arranging the second matching module 50 between the second RF chip 20 and the first switch chip 30, and arranging the first matching module 70 between the first RF chip 10 and the first switch chip 30, the signal transmission path for the RF signals of the first RF amplifier circuit to be transmitted to the first switch chip 30 and the signal transmission path for the RF signals output by the second RF amplifier circuit to be transmitted to the first switch chip 30 can be optimized, thus reducing the signal traces between the first RF chip and the first switch chip, and the signal trace between the second RF chip and the first switch chip, thereby optimizing the overall layout of the substrate.

In a specific embodiment, the substrate includes M first signal output ends A1, N second signal output ends A2 and K third signal output ends A3; the first signal output end A1 is used for outputting RF signals of the first frequency band, the second signal output end A2 is used for outputting RF signals of the second frequency band, and the third signal output end A3 is used for outputting RF signals of the third frequency band; and M, N and K are positive integers. For example, the number M of the first signal output end is 2, 3, 4 or 5, etc. The number N of second signal output end is 2, 3, 4 or 5, etc. The number K of the third signal output end is 2, 3, 4 or 5, etc. Different first signal output ends are used to output RF signals of different subbands in the first frequency band; different second signal output ends are used to output RF signals of different subbands in the second frequency band; and different third signal output ends are used to output RF signals of different subbands in the third frequency band. Optionally, the number M of the first signal output end, the number N of the second signal output end and the number K of the third signal output end may be the same or different.

As a specific embodiment, the first switch chip 30 is connected with at least one of the M first signal output ends A1 and at least one of the N second signal output ends A2. The second switch chip 40 is connected to at least one of the K third signal output ends. The RF signals of the first frequency band output by the first RF amplifier circuit is output by at least one of the M first signal output ends A1 after being output by the first switch chip 30; the RF signals of the second frequency band output by the second RF amplifier circuit is output by at least one of the N second signal output ends A2 after being output by the first switch chip 30; and the RF signals of the second frequency band output by the third RF amplifier circuit is output by at least one of the K second signal output ends A3 after being output by the second switch chip 40.

As a specific embodiment, the first switch chip 30 is arranged in the area near the first signal output end and the second signal output end, and the second switch chip 40 is arranged in the area near the third signal output end. Since the RF signals of the first frequency band and the RF signals of the second frequency band output by the first switch chip 30 need to be output through the first signal output end and the second signal output end on the substrate respectively, and the RF signals of the third frequency band output by the second switch chip 40 need to be output through the third signal output end on the substrate. Hence, in this embodiment, the first switch chip 30 is arranged in the area near the first signal output end and the second signal output end, and the second switch chip 40 is arranged in the area near the third signal output end. In this way, the signal transmission path between the first switch chip 30 and the first signal output end and the second signal output end can be reduced, and the signal transmission path between the second switch chip 40 and the third signal output end can be optimized, thereby reducing the signal traces on the substrate and optimizing the overall layout of the RF front-end module.

In a specific embodiment, as shown in FIG. 3 below, M first signal output ends and some of the second signal output ends are arranged on a first side of the substrate, and the first side of the substrate is arranged along a first direction; the rest of the second signal output ends and the K third signal output ends are arranged on a third side of the substrate; the second signal output end arranged on the first side of the substrate and the second signal output end arranged on the third side of the substrate are arranged adjacent to each other, the third side of the substrate is arranged along a second direction, and the first direction and the second direction intersect.

Optionally, the first direction is vertical and the second direction is horizontal, or the first direction is horizontal and the second direction is vertical. The second direction intersects with the first direction. For example, the horizontal direction may be the length direction of the substrate and the vertical direction may be the width direction of the substrate. It should be noted that the horizontal direction and the vertical direction in this embodiment include but are not limited to being perpendicular to each other. That is, the angle at which the first direction and the second direction intersect includes but is not limited to 90 degrees. For example, the angle of intersection between the first direction and the second direction may also be 80 degrees, 100 degrees, 120 degrees, 130 degrees, etc., as long as the first direction and the second direction intersect with each other.

As a specific embodiment, this embodiment takes the horizontal direction of the substrate as the first direction and the vertical direction of the substrate as the second direction as an example to illustrate. Specifically, M first signal output ends A1 and some of the second signal output ends A2 are arranged on a first side of the substrate, and the first side of the substrate is arranged along a first direction. For example, the first side of the substrate is arranged along the horizontal direction of the substrate, and the first side of the substrate may be the left side and the right side of the substrate along the horizontal direction. The rest of the second signal output ends and the K third signal output ends are arranged on a third side of the substrate; the third side of the substrate is arranged along a second direction, and the first direction and the second direction intersect. For example, the third side of the substrate is arranged along the vertical direction of the substrate, and the third side of the substrate may be the upper side and the lower side of the substrate along the vertical direction. And the second signal output end arranged on the first side of the substrate and the second signal output end arranged on the third side of the substrate are arranged adjacent to each other. For example, the first side of the substrate is the left side of the substrate in the horizontal direction, and the third side of the substrate is the lower side of the substrate in the vertical direction. In this case, some of the second signal output ends are arranged in the area where the left side of the substrate is adjacent to the lower side of the substrate; and the rest of the second signal output ends are arranged in the area where the lower side of the substrate is adjacent to the left side of the substrate.

In this embodiment, M first signal output ends and some of the second signal output ends are arranged on a first side of the substrate, and the first side of the substrate is arranged along a first direction; the rest of the second signal output ends and the K third signal output ends are arranged on a third side of the substrate; the second signal output end arranged on the first side of the substrate and the second signal output end arranged on the third side of the substrate are arranged adjacent to each other, the third side of the substrate is arranged along a second direction, and the first direction and the second direction intersect. Specifically, the first direction and the second direction intersect, so that the first switch chip 30 may be arranged adjacent to the first signal output end and the second signal output end, and the second switch chip 40 is arranged adjacent to the third signal output end, thereby optimizing the signal transmission path between the first switch chip 30 and the first signal output end and the second signal output end, and optimizing the signal transmission path between the second switch chip 40 and the third signal output end, thus reducing the signal traces on the substrate and optimizing the overall layout of the RF front-end module.

In a specific embodiment, an RF front-end module includes a substrate, and a first switch chip and a second switch chip arranged on the substrate; the substrate includes M first signal output ends, N second signal output ends and K third signal output ends; the first switch chip includes a first switch circuit and a second switch circuit; the second switch chip includes a third switch circuit, the first switch circuit is used for transmitting RF signals of a first frequency band to the first signal output end for output, the second switch circuit is used for transmitting RF signals of a second frequency band to the second signal output end for output, and the third switch circuit is used for transmitting RF signals of a third frequency band to the third signal output end for output; and the first switch chip is arranged in an area close to the first signal output end and the second signal output end, and the second switch chip is arranged in an area close to the third signal output end.

In this embodiment, RF signals of the first frequency band and RF signals of the second frequency band are respectively transmitted to the first signal output end and the second signal output end through the first switch chip, and RF signals of the third frequency band are transmitted to the third signal output end through the second switch chip; the first switch chip is arranged in the area close to the first signal output end and the second signal output end, and the second switch chip is arranged in the area close to the third signal output end. In this way, the integration level can be improved, and meanwhile, the signal transmission paths of the RF signals of the first frequency band and the second frequency band transmitted to the first signal output end and the second signal output end respectively through the first switch chip can be optimized, and the signal transmission path of the RF signals of the third frequency band transmitted to the third signal output end through the second switch chip can be optimized. Thereby reducing the signal traces on the substrate, avoid unnecessary loss caused by too many traces, and meet the requirements of the RF front-end module for performance and area.

In a specific embodiment, the RF front-end module further includes a first RF chip and a second RF chip; the first RF chip includes a first RF amplifier circuit, the second RF chip includes a second RF amplifier circuit and a third RF amplifier circuit; the first RF amplifier circuit is used for outputting the RF signals of the first frequency band, the second RF amplifier circuit is used for outputting the RF signals of the second frequency band, and RF signals output by the third RF amplifier circuit passes through the RF signals of the third frequency band.

It should be noted that the features of the first RF chip, the second RF chip, the first RF amplifier circuit, the second RF amplifier circuit and the third RF amplifier circuit in this embodiment are basically the same as those of the first RF chip, the second RF chip, the first RF amplifier circuit, the second RF amplifier circuit and the third RF amplifier circuit in the above embodiments. And their functions and effects are basically the same, so in order to save space, they are not repeated here.

In a specific embodiment, M first signal output ends and some of the second signal output ends are arranged on a first side of the substrate, and the first side of the substrate is arranged along a first direction; the rest of the second signal output ends and the K third signal output ends are arranged on a third side of the substrate; the second signal output end arranged on the first side of the substrate and the second signal output end arranged on the third side of the substrate are arranged adjacent to each other, the third side of the substrate is arranged along a second direction, and the first direction and the second direction intersect.

It should be noted that, the features of the first signal output end, the second signal output end and the third signal output end in this embodiment are the same as those of the first signal output end, the second signal output end, and the third signal output end in the above embodiments and their functions and effects are basically the same, so in order to save space, they are not repeated here.

In a specific embodiment, a first output pin of the first switch chip is connected with the first signal output end, the first output pin of the first switch chip is arranged on a fourth side of the first switch chip, and the fourth side of the first switch chip is arranged along the second direction, and the fourth side of the first switch chip is arranged adjacent to the first signal output end;

a second output pin of the first switch chip is connected with the second signal output end, and the second output pin of the first switch chip is arranged on a first side and/or a third side of the first switch chip, the first side of the first switch chip is arranged along the first direction, and the third side of the first switch chip is arranged along the second direction; and the first side of the first switch chip is adjacent to the first side of the substrate, and the third side of the first switch chip is adjacent to the third side of the substrate; and a third output pin of the second switch chip is connected with the third signal output end, the third output pin of the second switch chip is arranged on a third side of the second switch chip, the third side of the first switch chip is arranged along the second direction, and the third side of the second switch chip is arranged adjacent to the third side of the substrate.

It should be noted that, the features of the first output pin of the first switch chip, the second output pin of the first switch chip and the third output pin of the second switch chip in this embodiment are the same as those in the above embodiments. And their functions and effects are basically the same, so in order to save space, they are not repeated here.

The above embodiments are only used to illustrate the technical solution of the present application, rather than limit it. Although the application has been described in detail with reference to the foregoing embodiments, it should be understood by those skilled in the art that it is still possible to modify the technical solutions described in the foregoing embodiments, or equivalently replace some technical features thereof. These modifications and equivalents do not make the nature of the corresponding technical solution deviates from the spirit and scope of the present application, and shall be included in the protection scope of the present application.

What is claimed is:

1. An RF front-end module, comprising: a substrate, and a first RF chip, a second RF chip, a first switch chip and a second switch chip arranged on the substrate, wherein the first RF chip comprises a first RF amplifier circuit, and the second RF chip comprises a second RF amplifier circuit and a third RF amplifier circuit;

the first RF amplifier circuit outputs RF signals via the first switch chip, the second RF amplifier circuit outputs RF signals via the first switch chip, and the third RF amplifier circuit outputs RF signals via the second switch chip;

wherein the first RF amplifier circuit is used for amplifying RF signals in a first frequency band, the second RF amplifier circuit is used for amplifying RF signals in a second frequency band, and the third RF amplifier circuit is used for amplifying RF signals in a third frequency band; wherein the third frequency band is larger than the second frequency band, and the second frequency band is larger than the first frequency band;

wherein the substrate comprises M first signal output ends, N second signal output ends and K third signal output ends; the first signal output end is used for outputting RF signals of the first frequency band, the second signal output end is used for outputting RF signals of the second frequency band, and the third signal output end is used for outputting RF signals of the third frequency band; M, N and K are positive integers; and the first switch chip is arranged in an area close to the first signal output end and the second signal output end, and the second switch chip is arranged in an area close to the third signal output end.

2. The RF front-end module of claim 1, wherein the M first signal output ends and some of the second signal output ends are arranged on a first side of the substrate, and the first side of the substrate is arranged along a first direction; the rest of the second signal output ends and the K third signal output ends are arranged on a third side of the substrate; the second signal output end arranged on the first side of the substrate and the second signal output end arranged on the third side of the substrate are arranged adjacent to each other, the third side of the substrate is arranged along a second direction, and the first direction and the second direction intersect.

3. The RF front-end module of claim 2, wherein a first output pin of the first switch chip is connected with the first signal output end, the first output pin of the first switch chip is arranged on a fourth side of the first switch chip, and the fourth side of the first switch chip is arranged along the second direction, and the fourth side of the first switch chip is arranged adjacent to the first signal output end;

a second output pin of the first switch chip is connected with the second signal output end, and the second output pin of the first switch chip is arranged on a first side and/or a third side of the first switch chip, the first side of the first switch chip is arranged along the first direction, and the third side of the first switch chip is arranged along the second direction; and the first side of the first switch chip is adjacent to the first side of the substrate, and the third side of the first switch chip is adjacent to the third side of the substrate; and a third output pin of the second switch chip is connected with the third signal output end, the third output pin of the second switch chip is arranged on a third side of the second switch chip, the third side of the first switch chip is arranged along the second direction, and the third side of the second switch chip is arranged adjacent to the third side of the substrate.

4. An RF front-end module, comprising: a substrate, and a first RF chip, a second RF chip, a first switch chip and a second switch chip arranged on the substrate, wherein the first RF chip comprises a first RF amplifier circuit, and the second RF chip comprises a second RF amplifier circuit and a third RF amplifier circuit;

the first RF amplifier circuit outputs RF signals via the first switch chip, the second RF amplifier circuit outputs RF signals via the first switch chip, and the third RF amplifier circuit outputs RF signals via the second switch chip;

wherein the RF front-end module further comprises a second matching module and a third matching module;

the RF signals output by the second RF amplifier circuit is transmitted to the first switch chip through the second matching module, the second matching module is arranged between the third side of the second RF chip and the third side of the substrate, and both the third side of the second RF chip and the third side of the substrate are arranged along a second direction;

the RF signals output by the third RF amplifier circuit is transmitted to the second switch chip through the third matching module, and the third matching module is arranged between a second side of the second RF chip and a second side of the substrate, and both the second side of the second RF chip and the second side of the substrate are arranged along a first direction; and the first direction and the second direction intersect.

5. The RF front-end module of claim 4, wherein the second RF chip comprises a second signal output pin and a third signal output pin;

the second signal output pin is used to output the RF signals of the second RF amplifier circuit, and the third signal output pin is used to output the RF signals of the third RF amplifier circuit; and the second signal output pin is arranged on the third side of the second RF chip, and the third side of the second RF chip is arranged adjacent to the second matching module, the third signal output pin is arranged on the second side of the second RF chip, and the second side of the second RF chip is arranged adjacent to the third matching module.

6. An RF front-end module, comprising: a substrate, and a first RF chip, a second RF chip, a first switch chip and a second switch chip arranged on the substrate, wherein the first RF chip comprises a first RF amplifier circuit, and the second RF chip comprises a second RF amplifier circuit and a third RF amplifier circuit;

the first RF amplifier circuit outputs RF signals via the first switch chip, the second RF amplifier circuit outputs RF signals via the first switch chip, and the third RF amplifier circuit outputs RF signals via the second switch chip;

wherein the RF front-end module further comprises a first matching module and a second matching module, and the RF signals output by the first RF amplifier circuit is transmitted to the first switch chip through the first matching module, the first matching module is arranged between the first RF chip and the first switch chip; the RF signals output by the second RF amplifier circuit is transmitted to the first switch chip through the second matching module, the second matching module is arranged between the third side of the second RF chip and the third side of the substrate, and the third side of the second RF chip and the third side of the substrate are both arranged along a second direction.

7. The RF front-end module of claim 6, wherein the first RF chip comprise a first signal pin, the first signal pin is used to output the RF signals of the first RF amplifier circuit;

the first signal pin is arranged on a third side of the first RF chip, the third side of the first RF chip is arranged adjacent to the first matching module, and the third side of the first RF chip is arranged along the second direction; or the first signal pin is arranged on a first side of the first RF chip, the first side of the first RF chip is arranged adjacent to the first side of the substrate, and the first side of the first RF chip is arranged along a first direction, and the second direction intersects with the first direction.

8. The RF front-end module of claim 1, further comprising a control chip, and the first RF chip, the control chip and the second RF chip are sequentially arranged along a first direction of the substrate.

9. The RF front-end module of claim 8, wherein a fourth side of the substrate is provided with at least two first signal input ends, and the fourth side of the substrate is arranged along a second direction; the control chip comprises a switch unit and a control unit, and the at least two first signal input ends are connected with the first RF chip via the switch unit; the control unit is used for controlling state of the switch unit, so as to switch and enable the first signal input end to input RF signals of different sub-bands to the first RF chip; and the first RF chip and the control chip are arranged adjacent to the first signal input end.

10. The RF front-end module of claim 4, wherein a first area is further arranged between the third matching module and the second side of the substrate, at least one component is arranged in the first area, and the second side of the substrate is arranged along the first direction.

11. The RF front-end module of claim 10, wherein the third matching module comprises a first balun, the first balun comprises a first coil and a second coil, the first coil and the second coil are coupled with each other to form a first coupling area and a second coupling area, and the first coupling area and the second coupling area are arranged adjacent to each other along the second direction.

12. The RF front-end module of claim 1, wherein the substrate is composed of two metal layers.

13. The RF front-end module of claim 1, wherein the substrate is provided with a matching inductor, and the matching inductor is arranged on a same metal layer of the substrate through metal winding.

14. The RF front-end module of claim 8, further comprising a bridge module, and the control chip is connected to the second switch chip through the bridge module; the bridge module comprises a first trace, a first jumper wire and a second jumper wire, and the first trace is arranged adjacent to the second matching module, the second switch chip is connected to the control chip through the first jumper wire, the first trace and the second jumper wire in turn.

15. An RF front-end module, comprising: a substrate, and a second RF chip, a second matching module, a third matching module, a first switch chip and a second switch chip arranged on the substrate; the second RF chip comprises a second RF amplifier circuit and a third RF amplifier circuit;

RF signals output by the second RF amplifier circuit is transmitted to the first switch chip through the second matching module, the second matching module is arranged between a third side of the second RF chip and a third side of the substrate, and both the third side of the second RF chip and the third side of the substrate are arranged along a second direction; and RF signals output by the third RF amplifier circuit is transmitted to the second switch chip through the third matching module, and the third matching module is arranged between a second side of the second RF chip and a second side of the substrate, and both the second side of the second RF chip and the second side of the substrate are arranged along a first direction; and the first direction and the second direction intersect.

16. The RF front-end module of claim 15, wherein the second RF chip comprises a second signal output pin and a third signal output pin;

the second signal output pin is used to output the RF signals of the second RF amplifier circuit, and the third signal output pin is used to output the RF signals of the third RF amplifier circuit; and the second signal output pin is arranged on the third side of the second RF chip, and the third side of the second RF chip is arranged adjacent to the second matching module, the third signal output pin is arranged on the second side of the second RF chip, and the second side of the second RF chip is arranged adjacent to the third matching module.

17. The RF front-end module of claim 15, further comprising a first RF chip and a first matching module; the first RF chip comprises a first RF amplifier circuit, RF signals output by the first RF amplifier circuit is transmitted to the first switch chip through the first matching module, and the first matching module is arranged between the first RF chip and the first switch chip; RF signals output by the second RF amplifier circuit is transmitted to the first switch chip through the second matching module, and the second matching module is arranged between the second RF chip and the first switch chip.

18. The RF front-end module of claim 15, wherein the substrate comprises M first signal output ends, N second signal output ends and K third signal output ends; the first signal output end is used to output the RF signals of the first RF amplifier circuit, the second signal output end is used to output the RF signals of the second RF amplifier circuit, and the third signal output end is used to output the RF signals of the third RF amplifier circuit; the first switch chip is arranged in an area close to the first signal output end and the second signal output end, and the second switch chip is arranged in an area close to the third signal output end; and the M first signal output ends and some of the second signal output ends are arranged on a first side of the substrate, and the first side of the substrate is arranged along the first direction; the rest of the second signal output ends and K third signal output ends are arranged on the third side of the substrate; the second signal output end arranged on the first side of the substrate and the second signal output end arranged on the third side of the substrate are arranged adjacent to each other, and the third side of the substrate is arranged along the second direction, and the first direction and the second direction intersect.

* * * * *